US006855030B2

(12) United States Patent
Halley

(10) Patent No.: US 6,855,030 B2
(45) Date of Patent: Feb. 15, 2005

(54) MODULAR METHOD FOR CHEMICAL MECHANICAL PLANARIZATION

(75) Inventor: David G. Halley, Los Osos, CA (US)

(73) Assignee: Strasbaugh, San Luis Obispo, CA (US)

(*) Notice: Subject to any disclaimer, the term of this patent is extended or adjusted under 35 U.S.C. 154(b) by 28 days.

(21) Appl. No.: 10/327,712

(22) Filed: Dec. 19, 2002

(65) Prior Publication Data

US 2004/0048550 A1 Mar. 11, 2004

Related U.S. Application Data

(63) Continuation-in-part of application No. 09/699,286, filed on Oct. 26, 2000, now abandoned.

(60) Provisional application No. 60/161,705, filed on Oct. 27, 1999, provisional application No. 60/161,830, filed on Oct. 27, 1999, and provisional application No. 60/161,778, filed on Oct. 27, 1999.

(51) Int. Cl.[7] .................................................. B24B 1/00

(52) U.S. Cl. ............................... 451/5; 451/41; 451/57; 451/66; 451/67; 700/99

(58) Field of Search .............................. 451/41, 57, 66, 451/67, 5, 51, 56, 398, 456, 288; 700/99, 100, 102, 123

(56) References Cited

U.S. PATENT DOCUMENTS

| | | |
|---|---|---|
| 3,820,079 A | 6/1974 | Bergh et al. |
| 5,616,063 A | 4/1997 | Okumura et al. |
| 5,664,987 A | 9/1997 | Renteln |
| 5,751,582 A | 5/1998 | Saxena et al. |
| 5,792,709 A | 8/1998 | Robinson et al. |
| 5,827,110 A | 10/1998 | Yajima et al. |
| 5,830,045 A | 11/1998 | Togawa et al. |
| 5,938,504 A | 8/1999 | Talieh |
| 6,022,807 A | 2/2000 | Lindsey, Jr. et al. |
| 6,227,950 B1 | 5/2001 | Hempel et al. |
| 6,283,822 B1 | 9/2001 | Togawa et al. |

*Primary Examiner*—George Nguyen

(74) *Attorney, Agent, or Firm*—Townsend and Townsend and Crew LLP

(57) ABSTRACT

Specific embodiments of the present invention are directed to a method of operating a modular chemical mechanical planarization process. The method comprises operating CMP apparatus comprising a docking station having at least one CMP module and at least one cleaning module to process one or more substrates therein. The plurality of modules are controllable separately by individual controllers associated separately with the modules. One of the modules is disengaged from the docking station, and is mechanically removed to free the module from the docking station, while the other modules are still operable to process the one or more substrates therein.

21 Claims, 16 Drawing Sheets

100 277 270 116 260 310 275 119 250 110 120 117 115 120 120 118 118 320 270 360

MODULAR METHOD FOR CHEMICAL MECHANICAL PLANARIZATION

The present application is a continuation-in-part of U.S. patent application Ser. No. 09/699,286 filed Oct. 26, 2000, now abandoned, which is based on and claims the benefit of U.S. Provisional Patent Application Nos. 60/161,705, 60/161,830, and 60/161,778 filed Oct. 27, 1999. The entire disclosures of these applications are incorporated herein by reference.

BACKGROUND OF THE INVENTION

The present invention relates to the manufacture of electronic devices. More particularly, the invention provides a device for planarizing a film of material of an article such as a semiconductor wafer. In an exemplary embodiment, the present invention provides an improved substrate support for the manufacture of semiconductor integrated circuits. However, it will be recognized that the invention has a wider range of applicability; it can also be applied to flat panel displays, hard disks, raw wafers, MEMS wafers, and other objects that require a high degree of planarity.

The fabrication of integrated circuit devices often begins by producing semiconductor wafers cut from an ingot of single crystal silicon which is formed by pulling a seed from a silicon melt rotating in a crucible. The ingot is then sliced into individual wafers using a diamond cutting blade. Following the cutting operation, at least one surface (process surface) of the wafer is polished to a relatively flat, scratch-free surface. The polished surface area of the wafer is first subdivided into a plurality of die locations at which integrated circuits (IC) are subsequently formed. A series of wafer masking and processing steps are used to fabricate each IC. Thereafter, the individual dice are cut or scribed from the wafer and individually packaged and tested to complete the device manufacture process.

During IC manufacturing, the various masking and processing steps typically result in the formation of topographical irregularities on the wafer surface. For example, topographical surface irregularities are created after metallization, which includes a sequence of blanketing the wafer surface with a conductive metal layer and then etching away unwanted portions of the blanket metal layer to form a metallization interconnect pattern on each IC. This problem is exacerbated by the use of multilevel interconnects.

A common surface irregularity in a semiconductor wafer is known as a step. A step is the resulting height differential between the metal interconnect and the wafer surface where the metal has been removed. A typical VLSI chip on which a first metallization layer has been defined may contain several million steps, and the whole wafer may contain several hundred ICs.

Consequently, maintaining wafer surface planarity during fabrication is important. Photolithographic processes are typically pushed close to the limit of resolution in order to create maximum circuit density. Typical device geometries call for line widths on the order of 0.5 $\mu$m. Since these geometries are photolithographically produced, it is important that the wafer surface be highly planar in order to accurately focus the illumination radiation at a single plane of focus to achieve precise imaging over the entire surface of the wafer. A wafer surface that is not sufficiently planar, will result in structures that are poorly defined, with the circuits either being nonfunctional or, at best, exhibiting less than optimum performance. To alleviate these problems, the wafer is "planarized" at various points in the process to minimize non-planar topography and its adverse effects. As additional levels are added to multilevel-interconnection schemes and circuit features are scaled to submicron dimensions, the required degree of planarization increases. As circuit dimensions are reduced, interconnect levels must be globally planarized to produce a reliable, high density device. Planarization can be implemented in either the conductor or the dielectric layers.

In order to achieve the degree of planarity required to produce high density integrated circuits, chemical-mechanical planarization processes ("CMP") are being employed with increasing frequency. A conventional rotational CMP apparatus includes a wafer carrier for holding a semiconductor wafer. A soft, resilient pad is typically placed between the wafer carrier and the wafer, and the wafer is generally held against the resilient pad by a partial vacuum. The wafer carrier is designed to be continuously rotated by a drive motor. In addition, the wafer carrier typically is also designed for transverse movement. The rotational and transverse movement is intended to reduce variability in material removal rates over the surface of the wafer. The apparatus further includes a rotating platen on which is mounted a polishing pad. The platen is relatively large in comparison to the wafer, so that during the CMP process, the wafer may be moved across the surface of the polishing pad by the wafer carrier. A polishing slurry containing chemically-reactive solution, in which are suspended abrasive particles, is deposited through a supply tube onto the surface of the polishing pad.

CMP is advantageous because it can be performed in one step, in contrast to past planarization techniques which are complex, involving multiple steps. Moreover, CMP has been demonstrated to maintain high material removal rates of high surface features and low removal rates of low surface features, thus allowing for uniform planarization. CMP can also be used to remove different layers of material and various surface defects. CMP thus can improve the quality and reliability of the ICs formed on the wafer.

Chemical-mechanical planarization is a well developed planarization technique. The underlying chemistry and physics of the method is understood. However, it is commonly accepted that it still remains very difficult to obtain smooth results near the center of the wafer. The result is a planarized wafer whose center region may or may not be suitable for subsequent processing. Sometimes, therefore, it is not possible to fully utilize the entire surface of the wafer. This reduces yield and subsequently increases the per-chip manufacturing cost. Ultimately, the consumer suffers from higher prices.

It is therefore desirable to improve the useful surface of a semiconductor wafer to increase chip yield. What is needed is an improvement of the CMP technique to improve the degree of global planarity that can be achieved using CMP.

SUMMARY OF THE INVENTION

The present invention achieves these benefits in the context of known process technology and known techniques in the art. The present invention provides an improved planarization apparatus for chemical mechanical planarization (CMP). Specifically, the present invention provides an improved planarization apparatus that provides multi-action CMP, such as orbital and spin action, to achieve uniformity during planarization. The present invention further provides a modular system to reduce footprint and increase throughput.

In accordance with an aspect of the present invention, a method of operating a modular chemical mechanical planarization process comprises operating a CMP apparatus comprising a docking station including a plurality of CMP modules having at least one CMP module and at least one cleaning module to process one or more substrates therein. The plurality of modules are controllable separately by individual controllers associated separately with the modules. One of the modules is disengaged from the docking station, and is mechanically removed to free the module from the docking station, while the other modules are still operable to process the one or more substrates therein. In some embodiments, the disengaging comprises removing power and control signals from the docking station. The disengaging may comprise removing an exhaust port, a water line, and a plurality of chemical fluid lines from the docking station while the other modules are still operable to process the one or more substrates therein. The method may further include inserting a replacement module into the docking station and engaging the module for operation with the docking station. The disengaging and mechanically removing take less than five minutes. The cleaning station also dries the object. The replacement module may be prequalified by inserting it in a remote prequalification docking station and engaging the module for prequalification operation.

In accordance with another aspect of the invention, a method of operating a modular chemical mechanical planarization process comprises operating a CMP apparatus comprising a docking station including a plurality of modules having at least one CMP module and at least one cleaning module to process one or more substrates therein. The plurality of modules are controlled separately by individual controllers to process one or more substrates therein. One of the modules is disengaged from the docking station, while the other modules are still operable to process the one or more substrates therein.

In some embodiments, the method further comprises inserting a replacement module into the docking station and engaging the module for operation with the docking station while the other modules are still operable to process the one or more substrates therein. The replacement module has an individual controller associated with the replacement module separate from the controllers for the modules of the docking station. The method may further comprise prequalifying the replacement module using the individual controller associated with the replacement module to process one or more substrates therein for a preset process prior to inserting the replacement module into the docking station and engaging the module for operation with the docking station. Prequalifying the replacement module comprises processing one or more substrates therein for the preset process separately from the docking station, and verifying that the replacement module meets preset minimum performance requirements based on process results of the one or more substrates processed therein. Controlling the plurality of modules separately comprises controlling separately at least one of temperature, pressure, polish force, process timing, spindle and wafer chuck speeds, chemical and D.I. water flow, endpoint detection set points, and automated sequencing and timing of the modules.

In accordance with another aspect of the present invention, a method of operating a modular chemical mechanical planarization process comprises providing a plurality of modules having at least one CMP module and at least one cleaning module to process one or more substrates therein. The plurality of modules are controllable separately by individual controllers to process the one or more substrates therein. At least one of the plurality of modules is prequalified separately each for a preset process associated therewith using the individual controller associated with the at least one module. The plurality of modules including the at least one prequalified module are coupled with a docking station of a CMP apparatus. The CMP apparatus is operated to process one or more substrates in the plurality of modules.

In some embodiments, prequalifying the at least one module comprises processing one or more substrates therein for the preset process associated therewith separately from the docking station; and verifying that the at least one module meets preset minimum performance requirements based on process results of the one or more substrates processed therein.

DESCRIPTION OF THE SPECIFIC EMBODIMENTS

Figure 1:
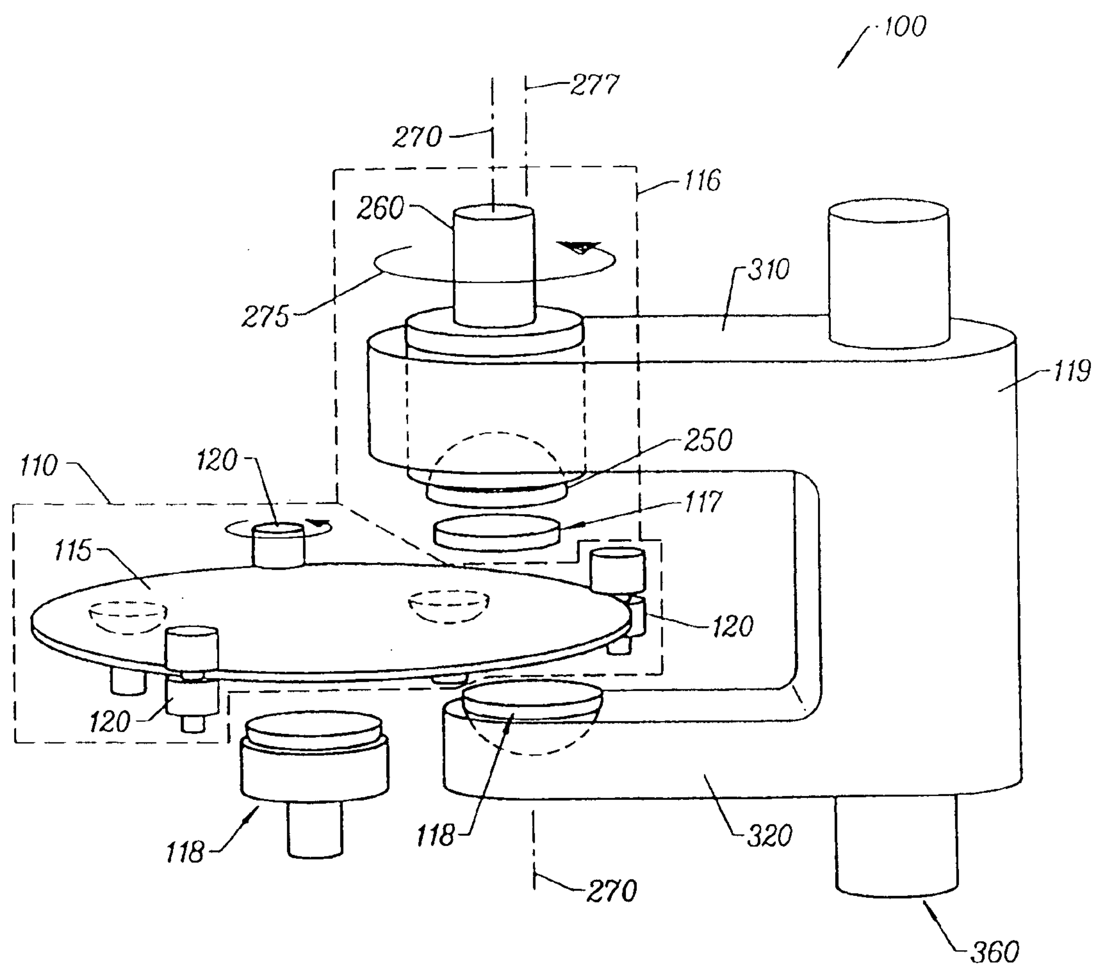
FIG. 1 is a simplified diagram of a planarization apparatus according to an embodiment of the present invention.

FIG. 1 is a simplified diagram of a planarization apparatus 100 according to an embodiment of the present invention. This diagram is merely an example, which should not limit the scope of the claims herein. One of ordinary skill in the art would recognize many other variations, modifications, and alternatives. In a specific embodiment, planarization apparatus 100 is a chemical-mechanical planarization apparatus.

Wafer Guide and Spin Assembly

The apparatus 100 includes an edge support, or a guide and spin assembly 110, that couples to the edge of an object, or a wafer 115. While the object in this specific embodiment is a wafer, the object can be other items such as a in-process wafer, a coated wafer, a wafer comprising a film, a disk, a panel, etc. Guide assembly 110 supports and positions wafer 115 during a planarization process. FIG. 1 also shows a polishing pad assembly 116 having a polishing pad 117, and a back-support 118 attached to a dual arm 119. Pad assembly 116, back support 117, dual arm 118 is described in detail below.

In a specific embodiment, guide assembly 110 includes rollers 120, each of which couples to the edge of wafer 115 to secure it in position during planarization. The embodiment of FIG. 1 shows three rollers. The actual number of rollers, however, will depend on various factors such as the shape and size of each roller, the shape and size of the wafer, and nature of the roller-wafer contact, etc. Also, at least one of the rollers 120 drives the wafer 115, that is, cause the wafer to rotate, or spin. The rest can serve as guides, providing support as the wafer is polished. The rollers 120 are positioned at various points along the wafer perimeter. As shown in FIG. 1, the rollers 120 attach to the wafer 115 at equidistant points along the wafer perimeter. The rollers 120 can be placed anywhere along the wafer perimeter. The distance between each roller will depend on the number of rollers, and on other factors related to the specific application.

Figure 1A:
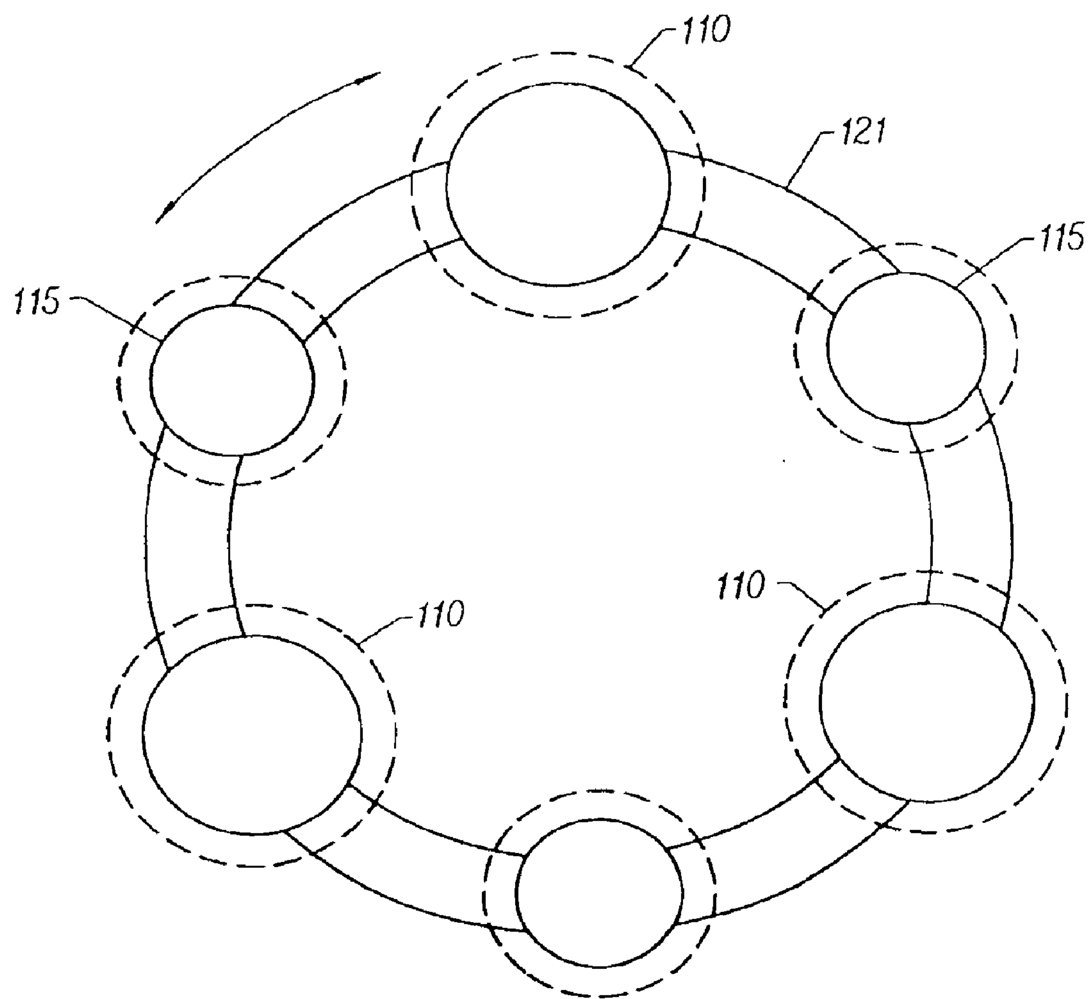
FIG. 1A is a simplified top-view diagram of a carousel for supporting multiple guide and spin assemblies according to an embodiment of the present invention.

The embodiment of FIG. 1 shows one guide and spin assembly 110. The actual number of such assemblies will depend on the specific application. For example, FIG. 1A shows a simplified top-view diagram of a carousel 121 for supporting multiple guide and spin assemblies 110 for processing multiple wafers 115 according to an embodiment of the present invention. In this specific embodiment, the carousel (FIG. 1A) can be used with multiple guide assemblies for planarizing many wafers. The actual size, shape, and configuration of the carousel will depend on the specific application. Also, when multiple guide assemblies are used, all guide assemblies need not be configured identically. The configuration of each guide assembly will depend on the specific application. For higher throughput, wafers are mounted onto the guide assemblies that are in cue during the planarization of one or more of the other wafers. For even higher throughput, such wafer carousels are configured to operatively couple to multiple planarization apparatus.

Figure 2:
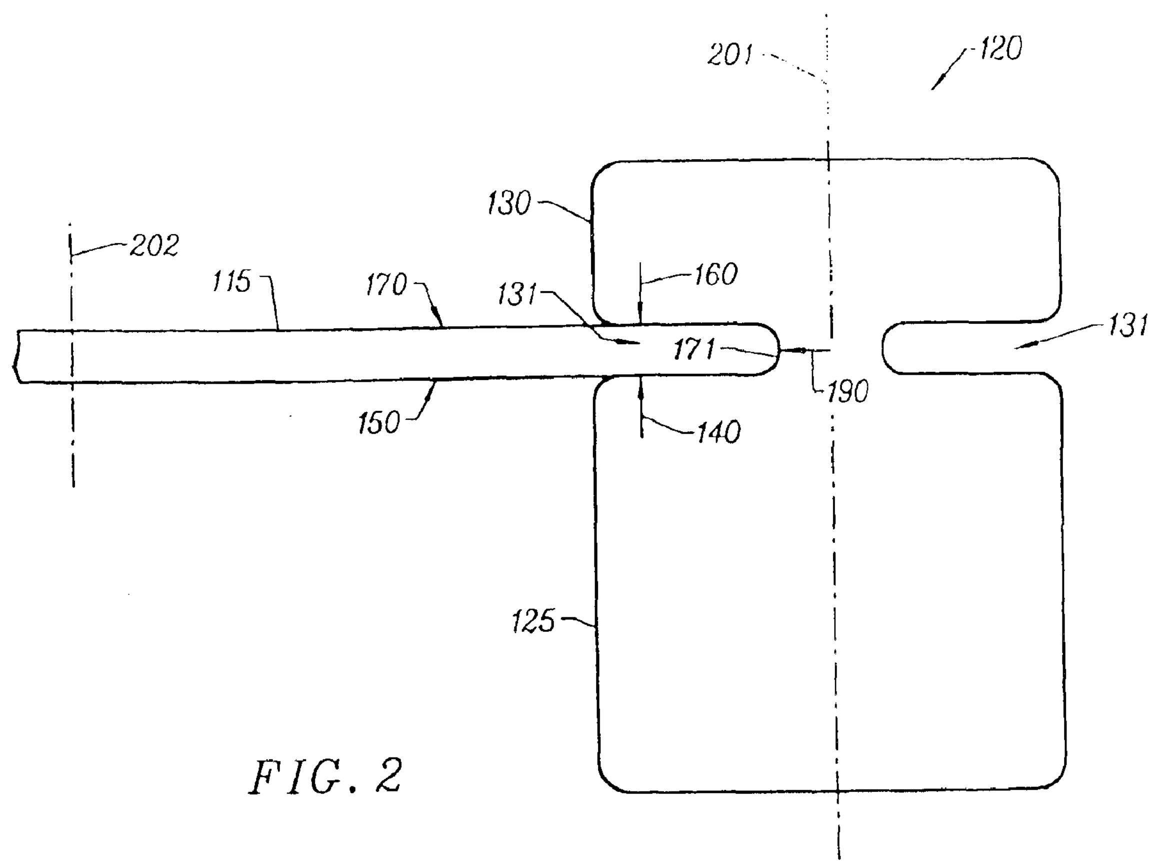
FIG. 2 is a detailed diagram of a guide and spin roller according to an embodiment of the present invention.

FIG. 2 is a detailed diagram of a roller 120 of FIG. 1 according to an embodiment of the present invention. This diagram is merely an example, which should not limit the scope of the claims herein. One of ordinary skill in the art would recognize many other variations, modifications, and alternatives. As shown, each roller 120 has a base portion 125, a top portion 130, and an annular notch 131 extending completely around the roller, and positioned between the base and top portions. The depth and shape of notch 131 will vary depending on the purpose of the specific roller. A roller designated to drive the rotation of the wafer might have a deeper notch to provide for more surface area contact with the wafer 115. Alternatively, a roller designated to merely guide the wafer might have a shallower notch, having enough depth to provide adequate support.

Figure 2A:
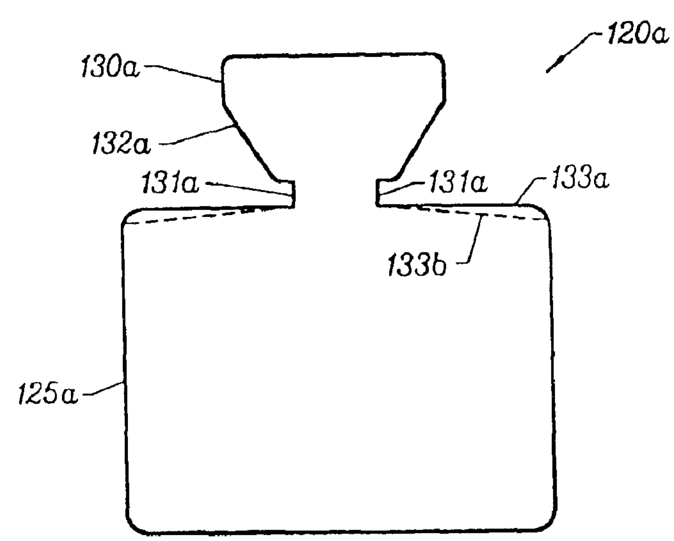
FIG. 2A is a diagram of a guide and spin roller according to another embodiment of the present invention.

FIG. 2A shows another roller 120*a* having a base portion 125*a* similar to the base portion 125 of FIG. 2. The top portion 130*a* has a smaller cross-section that the top portion 130 of FIG. 2, and desirably includes a tapered or inclined surface 132*a* tapering down to an annular notch 131*a* which is more shallow than the notch 131 of FIG. 2. The shallow notch 131*a* is sufficient to connect the roller 120*a* to the edge of the wafer 115. The top portion 130*a* and the shallow notch 131*a* make the engagement of the roller 120*a* with the edge of the wafer 115 easier. The replacement of the wafer 115 can also be performed more readily and quickly since the roller 120*a* with the smaller to portion 130*a* need not be retracted as far as the roller 120 of FIG. 2. The surface 133*a* of the bottom portion 125*a* may also be inclined by a small degree (e.g., about 1–5°) as indicated by the broken line 133*b* to further facilitate wafer engagement.

The edge of wafer 115 is positioned in the notch of each roller such that the process side of wafer 115 faces polishing pad 117. To secure wafer 115, the base portion of each roller provides an upward force 140 against the back side 150 of the wafer while the top portion provides a downward force 160 against the process surface 170 (side to be polished) of the wafer. For additional support, the inner wall 171 of the notch provides an inward force 190 against the wafer edge. The top and base portions 130, 125 constitute one piece. Alternatively, the top and base portions 130, 125 can include multiple pieces. For example, the top portion 130 can be a separate piece, such as a screw cap or other fastening device or the equivalent. Each roller 120 has a center axis 201 and each can rotate about its axis. Rotation can be clockwise or counterclockwise. Rotation can also accelerate or decelerate.

Guide and spin assembly 110 also has a roller base (not shown) for supporting the rollers. The size, shape, and configuration of the base will depend on the actual configuration of the planarization apparatus. For example, the base can be a simple flat surface that is attached to or integral to the planarization apparatus. The base can support some of the rollers, while at least one roller need to be retractable sufficiently to permit insertion and removal of the wafer 115, and need to be adjustable relative to the edge of the wafer 115 to control the force applied to the edge of the wafer 115.

In operation, during planarization, guide assembly 110 can move wafer 115 in various ways relative to polishing pad 117. For example, the guide assembly can move the wafer laterally, or provide translational displacement, in a fixed plane, the fixed plane being substantially parallel to a treatment surface of polishing pad 117 and back support 118. The guide assembly can also rotate, or spin, the wafer in the fixed plane about the wafer's axis. As a result, the guide assembly 110 translates the wafer 115 in the x-, y-, and z-directions, or a combination thereof During actual planarization, that is when a polishing pad contacts the wafer, the guide assembly can move the wafer laterally in a fixed plane. The guide assembly can translate the wafer in any number of predetermined patterns relative to the polishing pad. Such a predetermined pattern will vary and will depend on the specific application. For example, the pattern can be substantially radial, linear, etc. Also, at least when the polishing pad contacts the object during planarization, such a pattern can be continuous or discontinuous or a combination thereof.

Conventional translation mechanisms for x-, y-, z-translation can control and traverse the guide assembly. For example, alternative mechanisms include pulley-driven devices and pneumatically operated mechanisms. The guide assembly and the wafer can traverse relative to the polishing pad in a variety of patterns. For example, the traverse path can be radial, linear, orbital, stepped, etc. or any combination depending on the specific application. The rotation direction of the wafer can be clockwise or counter clockwise. The rotation speed can also accelerate or decelerate.

Still referring to FIG. 2, as indicated above, in addition to lateral movement, the guide assembly can also rotate, or spin, wafer 115 in the fixed plane about the wafer center axis 202. The fixed plane is substantially parallel to a treatment surface of polishing pad 117. One way to provide rotational movement is by using rollers 120 described above. As mentioned above, at least one roller rotates about its center axis to drive the wafer to rotate about its center axis. The other rollers can also drive the wafer to rotate. They can also rotate freely. As said, each roller can rotate about its center axis 201 in either a clockwise or counterclockwise direction. The wafer will rotate in the opposite direction of the driving roller.

Specifically, as one or more of the driving rollers spin along their rotational axis 201 during operation, the friction between the inner walls of notch 131 and the wafer edge cause wafer 115 to rotate along its own axis 202. The roller itself can provide the friction. For example, the notch can include ribs, ridges, grooves, etc. Alternatively, a layer of any known material having a sufficient friction coefficient, such as a rubber or polyamide material, can also provide friction. One of ordinary skill in the art would recognize many other variations, modifications, and alternatives. For example, each roller can be movably or immovably fixed to a base (not shown) and a wheel within the notch of each roller can spin, causing the wafer to spin.

To rotate, or spin, the wafer, one or more conventional drive motors (not shown) or the equivalent can be operatively coupled to the wafer, rollers, or roller base. The drive can be coupled to one or more of the rollers via a conventional drive belt (not shown) to spin the wafer. Alternatively, the drive can also couple to the guide assembly such that the entire guide assembly rotates about its center axis thereby causing the wafer to rotate about the guide assembly center axis. With all embodiments, the motor can be reversible such that the rotation direction 275 (FIG. 1) of the polishing pad 117 about its axis 270 can be clockwise or counter clockwise. Drive motor can also be a variable-speed device to control the rotational speed of the pad. Also, the rotational speed of the pad can also accelerate or decelerate depending on the specific application.

Alternatively, the edge support can also be stationary during planarization while a polishing pad rotates or moves laterally relative to the wafer. This variation is described in more detail below. During planarization, such movement occurs in the fixed plane at least when the polishing pad 117 contacts the wafer. During any part of or during the entire planarization process, any combination of the movements described above is possible.

Referring to FIG. 1, planarization apparatus 100 also includes a polishing head, or polishing pad assembly 116, for polishing wafer 115. Pad assembly 116 includes polishing pad 117, a polishing pad chuck 250 for securing and supporting polishing pad 117, and a polishing pad spindle 260 coupled to chuck 250 for rotation of pad 117 about its axis 270. According to a specific embodiment, the pad diameter is substantially less than the wafer diameter, typically 20% of the wafer diameter.

To rotate, or spin, the wafer, one or more conventional drive motors (not shown) or the equivalent can be operatively coupled to polishing pad spindle 260 via a conventional drive belt (not shown). The motor can be reversible such that the rotation direction 275 of polishing pad 117 can be clockwise or counter clockwise. Drive motor can also be a variable-speed device to control the rotational speed of the polishing pad. Also, the rotational speed of the polishing pad can also accelerate or decelerate depending on the specific application.

Polishing and Back Support Assembly

The planarization apparatus also includes a base, or dual arm 119. While the base can have any number of configurations, the specific embodiment shown is a dual arm. Pad assembly 116 couples to back support 118 via dual arm 119. Dual arm 119 has a first arm 310 for supporting pad assembly 116 and a second arm 320 for supporting back support 118. The arms 310, 320 may be configured to move together or, more desirably, can move independently. The arms 310, 320 can be moved separately to different stations for changing pad or puck and facilitate ease of assembling the components for the polishing operation.

According to a specific embodiment of the invention, back support 118 tracks polishing pad 117 to provide support to wafer 115 during planarization. This can be accomplished with the dual arm. In a specific embodiment, the pad assembly 116 attaches to first arm 310 and back support 118 attaches to second arm 320. Dual arm 119 is configured to position the pad assembly 116 and back support 118 such that a support surface of back support 118 faces the polishing pad 117 and such that the support surface of back support 118 and polishing pad 117 are substantially planar to one another. Also, according to the present invention, the centers of the polishing pad and surface of the back support are precisely aligned. This precision alignment allows for predicable and precise planarization. Precision alignment is ensured when the first and second arms constitute one piece. Alternatively, both arms can include multiple components and may be movable independently. As such, the components are substantially stable such that the precision alignment is maintained.

Specifically, according to one embodiment, dual arm 119 supports pad assembly 116 such that spindle 260 passes rotatably through first arm 310 towards back support 118 which is supported by second arm 320. The rotational axis 270 of the pad 117 is equivalent to that of the spindle 260. Rotational axis 270 is positioned to pass through back support 118, preferably through the center of the back support 118. Pad assembly 116 is configured for motion in the direction of wafer 115. FIG. 1 shows the process surface of the wafer positioned substantially horizontally and facing upwardly.

According to a specific embodiment of the present invention, the entire planarization system can be configured to polish the wafer in a variety of positions. During planarization, for example, the dual arm 119 can be positioned such that the wafer 115 is controllably polished in a horizontal position or a vertical position, or in any angle.

These variations are possible because the wafer 115 is supported by rollers 120 rather than by gravity. Such flexibility is useful in, for example, a slurry-less polish system.

In operation, dual arm 119 can translate pad assembly 116 relative to wafer 115 in a variety of ways. For example, the dual arm 119 can pivot about the pivot shaft to traverse the pad 117 radially across the wafer 115. In another embodiment, both arms 310 and 320 can extend telescopically (not shown) to traverse the pad laterally linearly across the wafer 115. Both radial and linear movements can also be combined to create a variety of traversal paths, or patterns, relative to the wafer 115. Such patterns can be, for example, radial, linear, orbital, stepped, continuous, discontinuous, or any combination thereof. The actual traverse path will of course depend on the specific application.

Figure 3:
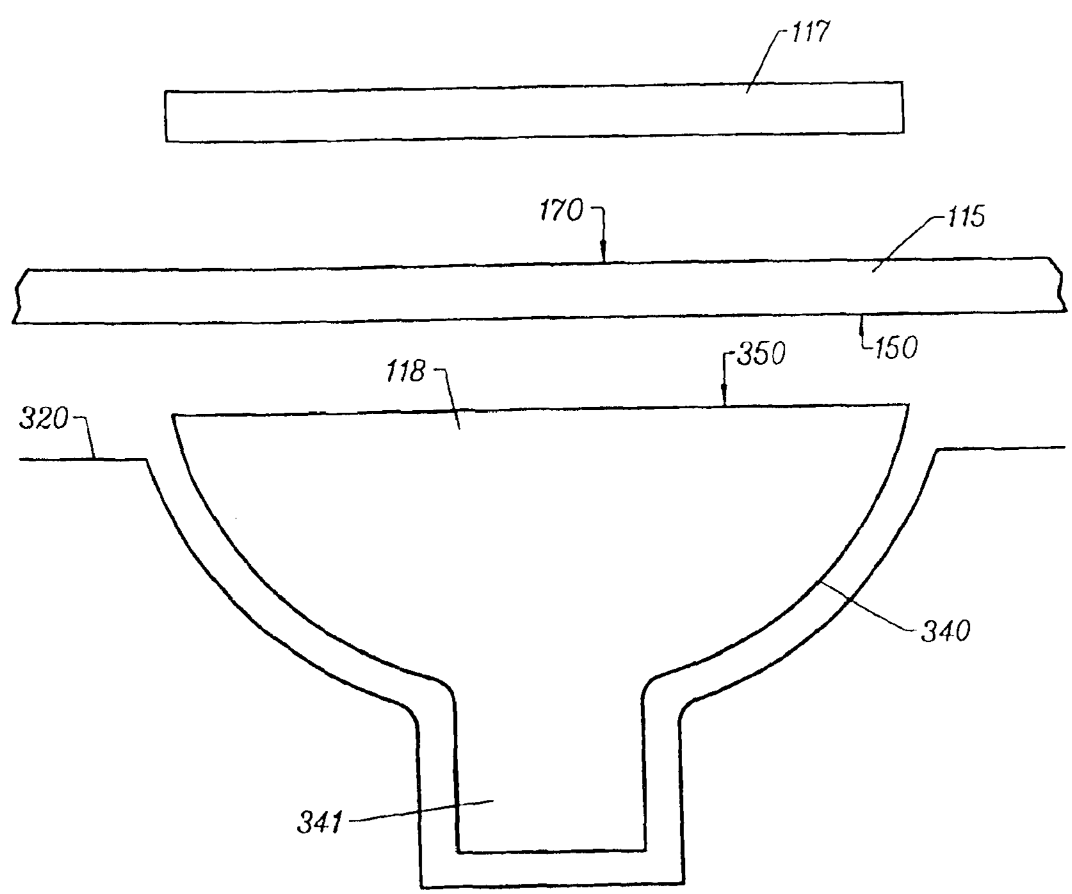
FIG. 3 is a detailed diagram of a polish pad back support according to an embodiment of the present invention.

FIG. 3 is a detailed diagram of back support 118 of FIG. 1 according to an embodiment of the present invention. This diagram is merely an example, which should not limit the scope of the claims herein. One of ordinary skill in the art would recognize many other variations, modifications, and alternatives. Back support 118 supports wafer 115 during planarization. Specifically, back support 118 dynamically tracks polishing pad 117 to provide local support to wafer 115 during planarization. Such local support eliminates wafer deformation due to the force of the polishing pad against the wafer during planarization. This also results in uniform polishing and thus planarity. In a specific embodiment, the back support 118 operatively couples to the pad assembly 116 via the dual arm 119. In a specific embodiment, the back support 118 is removably embedded in second arm 320 of the dual arm. Referring to FIG. 1, rotational axis 270 of polishing pad 117 and spindle 260 pass through back support 118.

Referring back to FIG. 3, back support 118 can be configured in any number of ways for supporting wafer 115 during planarization. In a specific embodiment, back support 118 has a flat portion, or support surface 350, that contacts the back side 150 of the wafer during planarization. The support surface 350 desirably provides a substantially friction free interface between surface 350 and back side 150 of the wafer by using a low-friction solid material such as Teflon. Alternatively, the support surface 350 may support a fluid bearing as the frictionless interface with the back side 150. The fluid may be a gas such as air or a liquid such as water, which may be beneficial for serving the additional function of cleaning the back side 150 of the wafer. This friction free interface allows the wafer to move across the surface of the back Support.

Support surface 350 is substantially planar with the wafer 115 and pad 117. The diameter of the surface should be large enough to provide adequate support to the object during planarization. In a specific embodiment, the back support surface has a diameter that is substantially the same size as the polishing pad diameter. In FIG. 3, the back support 118 shown is a spherical air bearing and has a spherical portion 340 allowing it to be easily inserted into second arm 320. The rotation of the spherical portion 340 relative to the second arm allows the back support 118 to track the polishing pad 117 and support the wafer 115 with the support surface 350. The back support 118 in FIG. 3 has a protrusion 341 into a cavity of the second arm. The protrusion 341 may serve to limit the rotation of the back support 118 relative to the second arm 320 during tracking of the polishing pad 117. In an alternate embodiment, the back support 118 may be generally hemispherical without the protrusion.

The process surface 170 of the wafer 115 faces the pad 117 and the back side 150 of the wafer 115 faces the back support 118. Also, the wafer 115 is substantially planar with both the pad 117 and back support 118. In another embodiment, the back support 118 can be replaced with a second polishing pad assembly for double-sided polishing. In such an embodiment, the second pad assembly can be configured similarly to the first pad assembly on the first arm. The polishing pads of each are substantially planar to one another and to the wafer 115.

In a specific embodiment, the back support is a bearing. In this specific embodiment, the bearing can be a low-friction solid material (e.g., Teflon), an air bearing, a liquid bearing, or the equivalent. The type of bearing will depend on the specific application and types of bearing available.

Figure 3A:
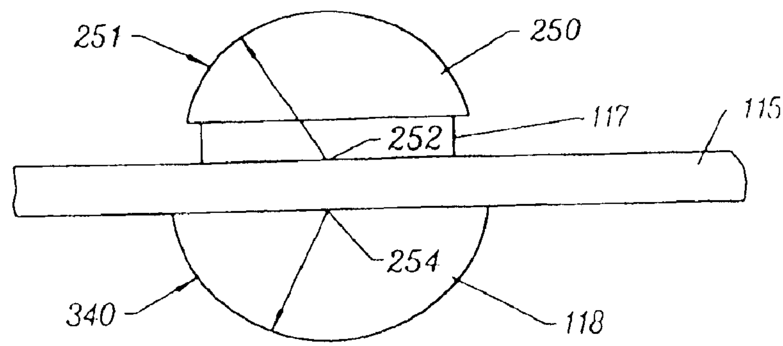
FIG. 3A is a simplified diagram of a support mechanism for supporting the wafer with projected gimbal points according to an embodiment of the present invention.
Figure 3B:
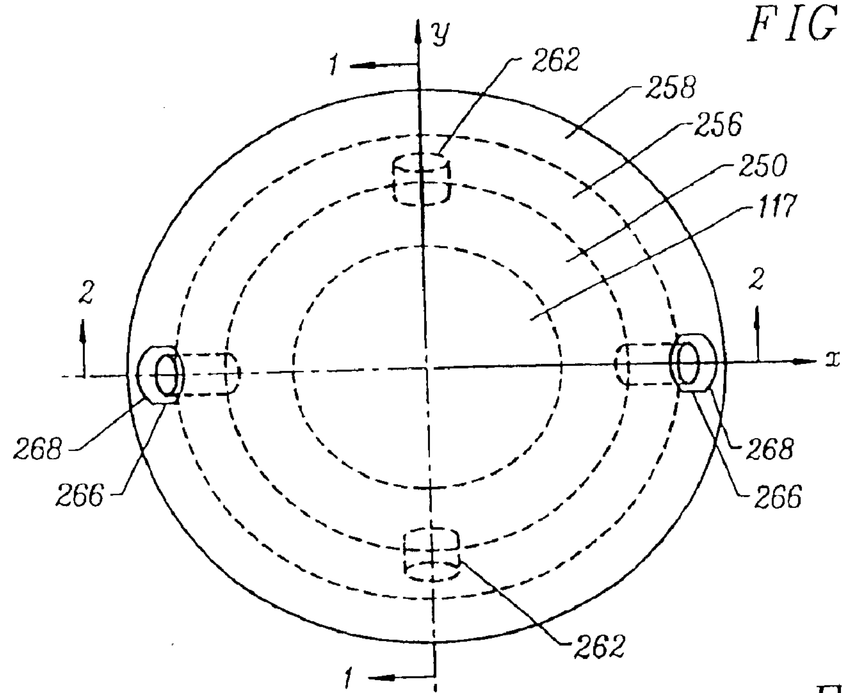
FIG. 3B is a top plan view of a gimbal drive support for the polishing pad with project gimbal point.
Figure 3C:
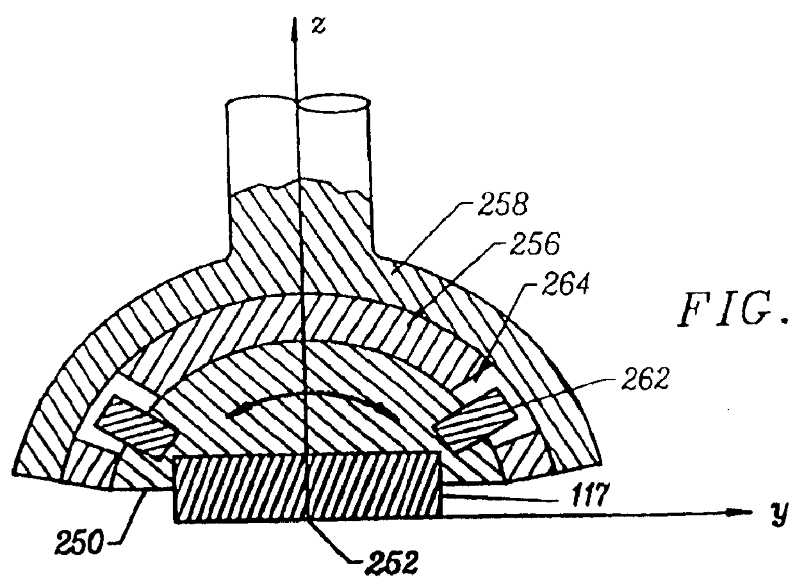
FIG. 3C is a cross-sectional view of the gimbal drive support of FIG. 3B along 1—1.
Figure 3D:
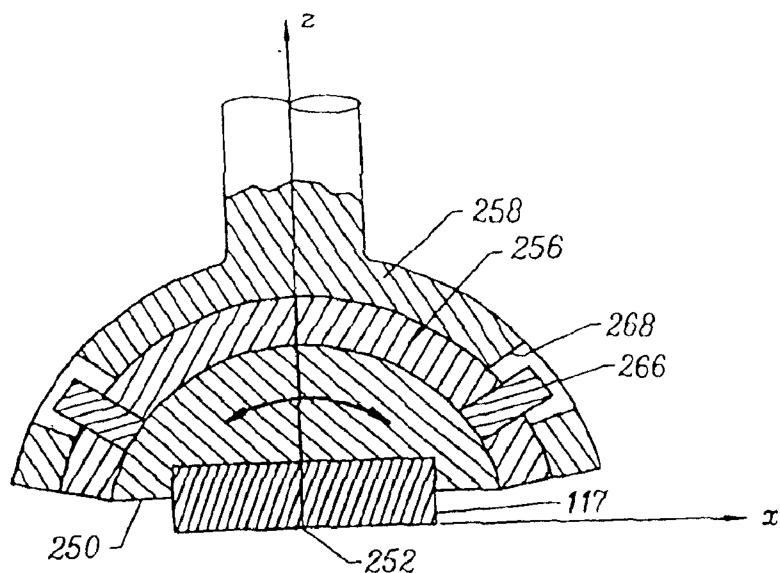
FIG. 3D is a cross-sectional view of the gimbal drive support of FIG. 3B along 2—2.
Figure 3E:
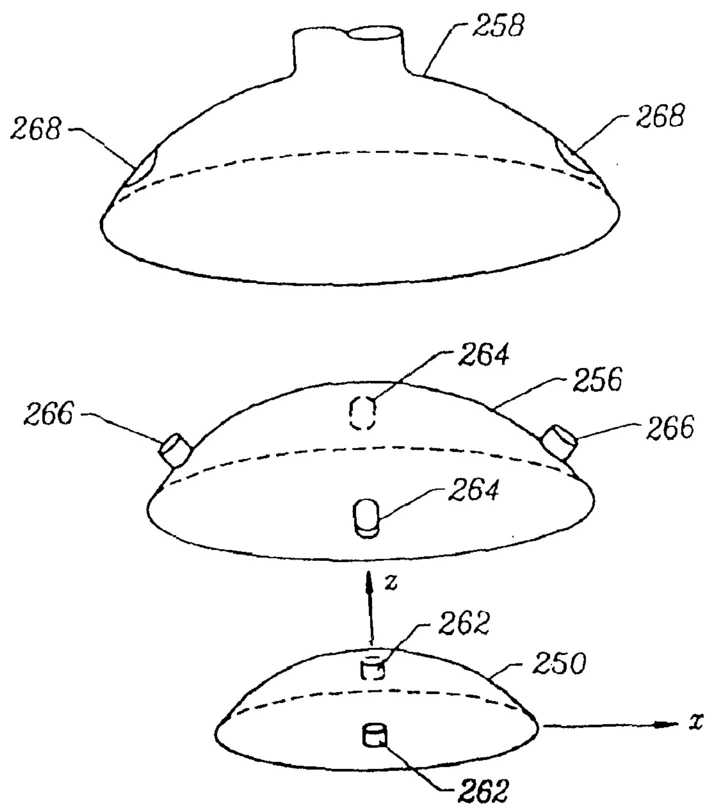
FIG. 3E is an exploded perspective view of the gimbal drive support of FIG. 3B.

In the specific embodiment as shown in FIG. 1, the dual arm 119 is a C-shaped clamp having projected gimbal points that allow for flexing of the dual arm 119 and still keep the face of the wafer in good contact with the polishing pad 117. The projected gimbal points are more clearly illustrated in FIG. 3A. The polishing pad chuck 250 is supported by the first arm 310, and the back support 118 is supported by the second arm 320. The polishing pad chuck 250 has a hemispherical surface 251 centered about a pivot point or gimbal point 252 which preferably is disposed at or near the upper surface of the wafer 115. Positioning the gimbal point 252 at or near the surface of the wafer 115 allows gimbal motion or pivoting of the chuck 250 relative to the first arm 310 without the problem of cocking. Cocking occurs when the projected gimbal point is above the wafer surface, and causes the forward end of the polishing pad 117 to dig into the wafer surface at the forward edge and lift up at the rear edge. The cocking is inherently unstable. Positioning the project gimbal point on the wafer surface avoids cocking. If the gimbal point is projected below the surface of the wafer, friction between the polishing pad 117 and the wafer surface produces a skiing effect which lifts the forward edge of the polishing pad 117 and causes the rear edge to dig into the wafer surface as the polishing pad moves relative to the wafer surface. This is more stable than cocking. The desirable maximum distance between the projected gimbal point and the wafer surface depends on the size of the polishing pad 117. For example, the distance may be less than about 0.1 inch for a polishing pad having a diameter of about 1.5 inch. The distance is desirably less than about 0.1 times, more desirably less than about 0.02 times, the diameter of the polishing pad. Likewise, the spherical surface 340 of the back support 118 desirably has a projected pivot point 254 disposed at or near the lower surface of the wafer 115.

FIGS. 3B–3E show the gimbal mechanism coupling the polishing pad chuck 250 with the first arm 310. The chuck 250 is connected to an inner cup 256 which is connected to an outer cup 258 that is supported by the first arm 310 of the dual arm 119. A torsional drive motor may be coupled with the outer cup 258 to rotate the polishing pad 117 via the gimbal mechanism around the z-axis. A pair of inner drive pins 262 extend from the chuck 250 into radial slots 264 provided in the inner cup 256 and extending generally in the direction of the y-axis. The radial slots 264 constrain the inner drive pins 262 in the circumferential direction so that the chuck 250 moves with the inner cup 256 in the circumferential direction around the z-axis. The inner drive pins 262 may move along the radial slots 264 to permit rotation of the chuck 250 relative to the inner cup 256 around the x-axis.

A pair of outer drive pins 266 extend from the inner cup 256 into radial slots 268 provided in the outer cup 258 and extending generally in the direction of the x-axis. The radial slots 268 constrain the outer drive pins 266 in the circumferential direction so that the inner cup 256 moves with the outer cup 258 in the circumferential direction around the z-axis. The outer drive pins 266 may move along the radial slots 268 to permit rotation of the inner cup 256 relative to the outer cup 258 around the y-axis.

The hemispherical drive cups 256, 258 isolate two axes of motion to allow full gimbal of the gimbal mechanism about the gimbal point or pivot point 252. The gimbal mechanism allows transmission of the torsional drive of the polishing pad 117 about the z-axis without inducing a torque moment on the polishing pad 117 at the interface with the wafer surface to produce a skiing effect. The polishing pad 117 becomes self-aligning with respect to the surface of the wafer 115 which may be offset from the x-y plane.

The gimbal mechanism shown in FIGS. 3B–3E is merely illustrative. In different embodiments, the drive pins may be replaced by machined protrusions. Balls or rollers that fit into mating, crossing grooves may be used to provide rolling contact with low friction between the movable members of the mechanism. Although the embodiment shown includes a single track in the x-direction and a single track in the y-direction, additional tracks may be provided. The members of the assembly may have other shapes different from the spherical members and still provide gimbal movements or spherical drive motions. It is understood that other ways of supporting the wafer and of tracking the polishing pad may be employed to provide the projected gimbal point at the desired location.

Planarization apparatus 100 operates as follows. Referring back to FIG. 1, assembly 110 positions wafer 115 between polishing pad 117 and back support 118. The polishing pad is lowered onto the process surface 170 of the wafer 115. Pad assembly 116 is driven by a conventional actuator (not shown), a piston-driven mechanism, for example, having variable-force control to control the downward pressure of the pad 117 upon the process surface 170. The actuator is typically equipped with a force transducer to provide a downforce measurement that can be readily converted to a pad pressure reading. Numerous pressure-sensing actuator designs, known in the relevant engineering arts, can be used.

Figure 4:
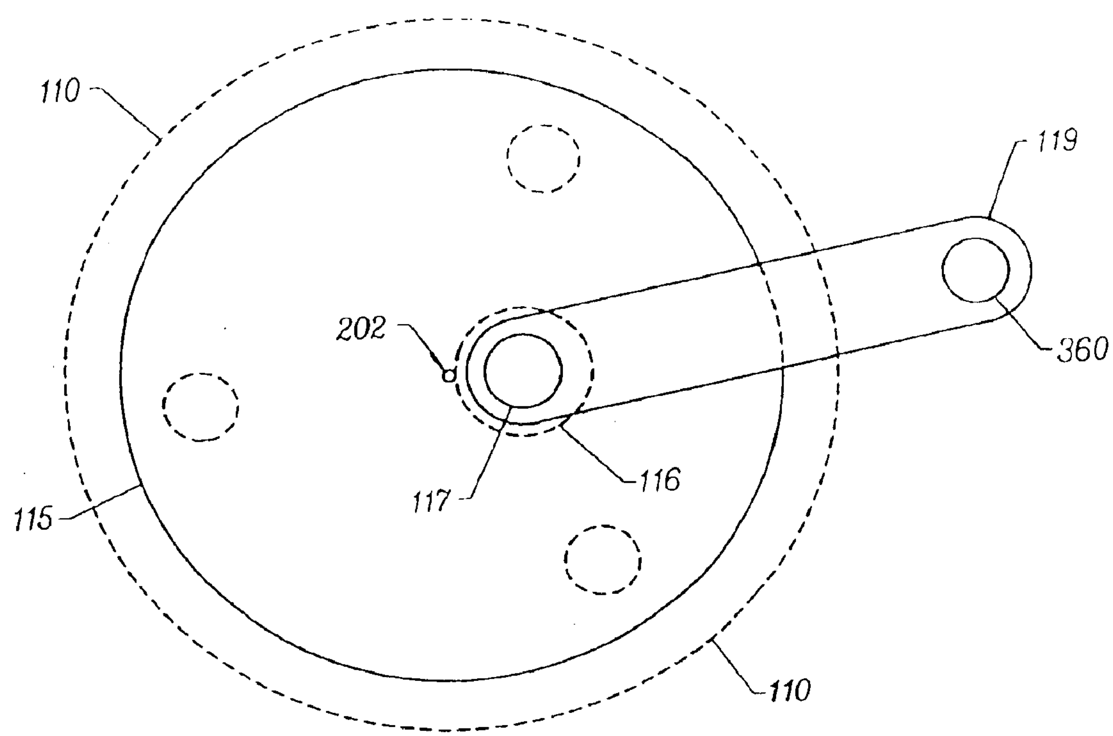
FIG. 4 is a simplified top-view diagram of a planarization apparatus according to an embodiment of the present invention.

FIG. 4 is a simplified top-view diagram of planarization apparatus 100 according to an embodiment of the present invention. This diagram is merely an example, which should not limit the scope of the claims herein. One of ordinary skill in the art would recognize many other variations, modifications, and alternatives. In a specific embodiment, dual arm 119 is configured to pivot about a pivot shaft 360 to provide translational displacement of pad assembly 116, and polishing pad 117, relative to guide and spin assembly 110, and wafer 115. Pivot shaft 360 is fixed to a planarization apparatus system (not shown).

Figure 4A:
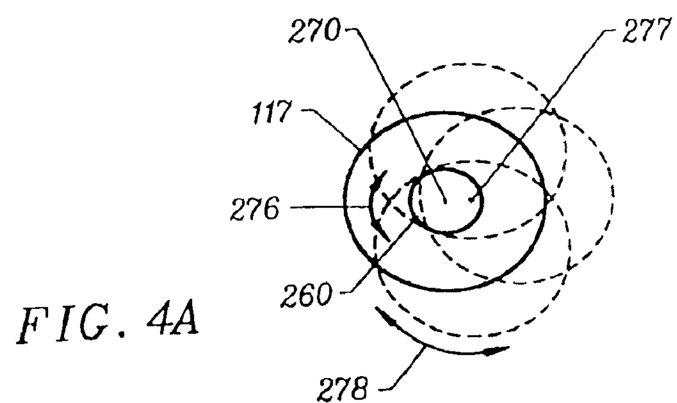
FIG. 4A is a simplified top-view diagram of the polishing pad and spindle illustrating spin and orbit rotations.

The polishing pad spindle 260 may also rotate to rotate the polishing pad 117, as illustrated in FIG. 4A. In addition to the spin rotation 276 about its own axis 270, the spindle 260 may also orbit about an orbital axis 277 in directions 278 to produce orbiting of the polishing pad 117 as shown in broken lines. The orbital axis 277 is offset from the spin axis 270 by a distance which may be selected based on the size of the wafer 115 and the size of the polishing pad 117. For instance, the offset distance may range from about 0.01 inch to several inches. In a specific example, the distance is about 0.25 inch. The orbital rotation is more clearly illustrated in FIG. 4A. Different motors may be used to drive the spindle 260 in spin and to drive the spindle 260 in orbital rotation.

Figure 4B:
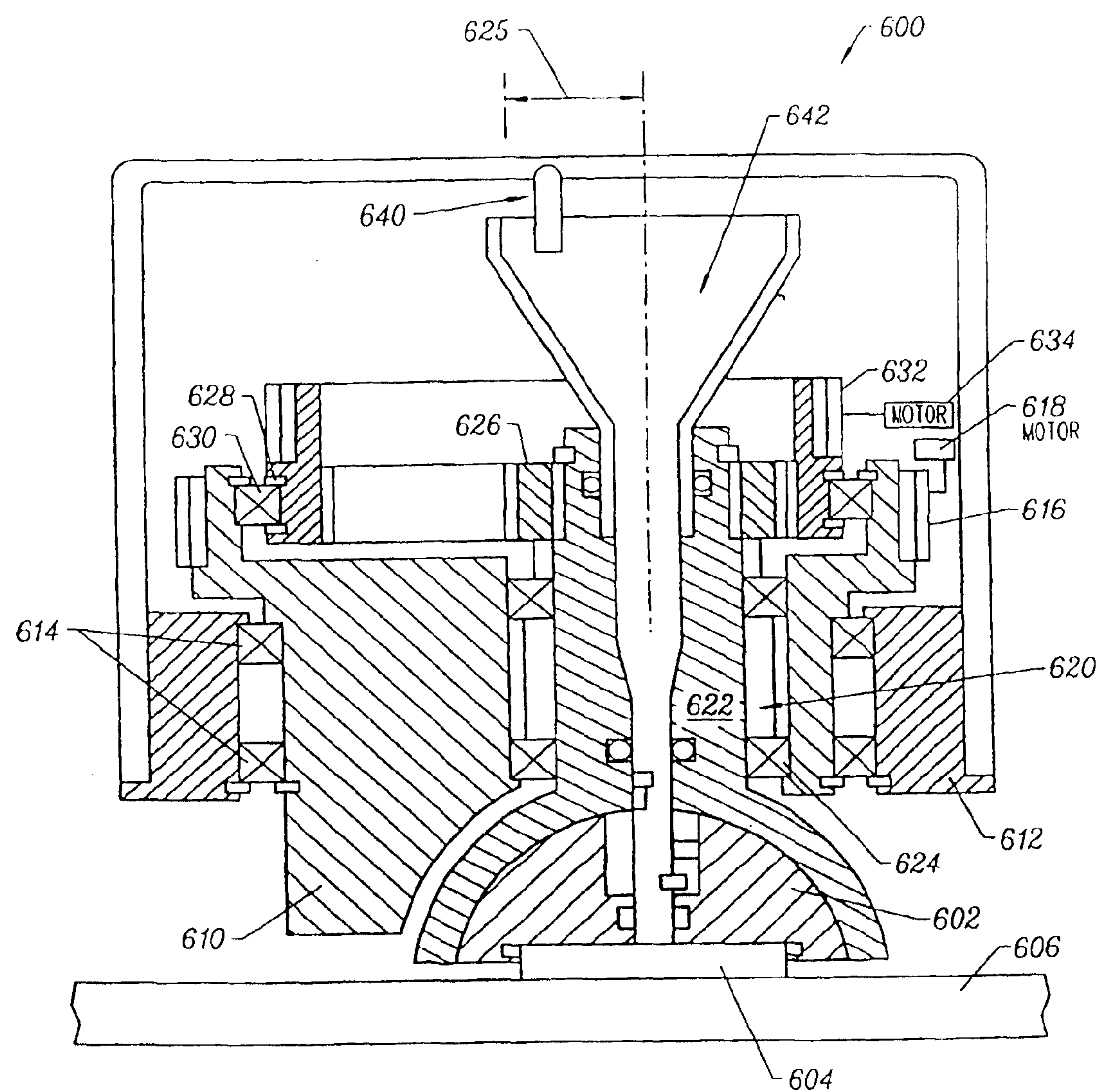
FIG. 4B is a sectional view diagram of the orbit and spin mechanism for the polishing head in accordance with an embodiment of the present invention.

FIG. 4B shows an apparatus 600 that allows both orbital and pure spin motion of a polishing head 602 that holds a polishing pad 604 which is smaller in size than the wafer 606 for planarizing the wafer. An orbit housing 610 is held in place with respect to the arm frame 612 by bearings 614 and driven directly by a direct orbit motor or through an orbit belt or an orbit gear. FIG. 4B shows an orbit drive belt 616 coupled to an orbit motor 618. The orbit housing 610 has an eccentric or offset hole 620 which supports a shaft 622 with bearings 624. The shaft 622 is offset from the centerline of the orbit housing 610 by an offset 625 which may be set to any desired amount (e.g., about 0.5 inch). The shaft 622 is connected to the polishing head 602. An external tooth gear 626 (or friction drive or the like) is attached to the shaft 622 and mates with an internal tooth gear 628 (or friction drive). The internal tooth gear is a ring gear 628 supported by another bearing 630 concentric with the outer orbit housing bearings 614, and is driven by a direct spin motor, or through a spin gear or a shaft drive belt. FIG. 4B shows a spin drive belt 632 coupled to a spin motor 634. By controlling the relative speeds of the orbit motor 618 and the spin motor 634, the polishing head 602 can be made to spin only (while holding the orbit motor 634 stationary), to spin and orbit (i.e., to precess), or to orbit only (by controlling the relative motions of the two motors 618, 634 so that the polishing pad 604 does not spin relative to the wafer 606). FIG. 4B also shows a chemical/fluid/slurry supply 640 supplying the chemical/fluid/slurry through a feed passage 642 to the polishing pad 604.

The inventors have discovered that improved uniformity of planarization can be achieved by polishing the center of the wafer by predominately orbital motion and polishing the edge of the wafer by predominately spin motion. Predominate orbital motion at the center of the wafer produces relatively uniform surface velocity motion to the entire polish pad surface where the center of the wafer is at a theoretical zero velocity. This results in good uniformity at the center of the wafer while maintaining superior planarity. Pure spin motion allows a very precise balance position at the edge of the wafer to give superior edge exclusion polish results where the orbital motion causes the pad to tend to drop off the edge too far before the center of action can be close enough to the edge to achieve good removal. This produces good uniformity results at the edge of the wafer while maintaining superior planarity results. In some embodiments, the orbiting speed is greater than the spinning speed when the polishing pad is contacted with the center region of the wafer. In a specific embodiment, the spinning speed is approximately zero at the center region. In some embodiments, the spinning speed is greater than the orbiting speed when the polishing pad is contacted with an edge region of the wafer. In a specific embodiment, the orbiting speed is approximately zero at the edge region.

The inventors have also found that uniformity can be affected by the relative wafer rotational speed and orbiting speed of the polishing pad. For instance, during combined orbital motion and rotation of the wafer, if the ratio of the greater of the orbiting speed and the wafer rotational speed to the lesser of the two is an integer, then the polishing pattern will repeat in a Rosette pattern and produces non-uniformity polishing. Typically, the orbiting speed is larger than the wafer rotational speed. Thus, it is desirable to have the ratio of the two speeds be a non-integer to achieve improved uniformity during planarization. For example, if the orbiting speed is 1000 rpm, the wafer rotational speed may be 63 rpm.

Figure 5:
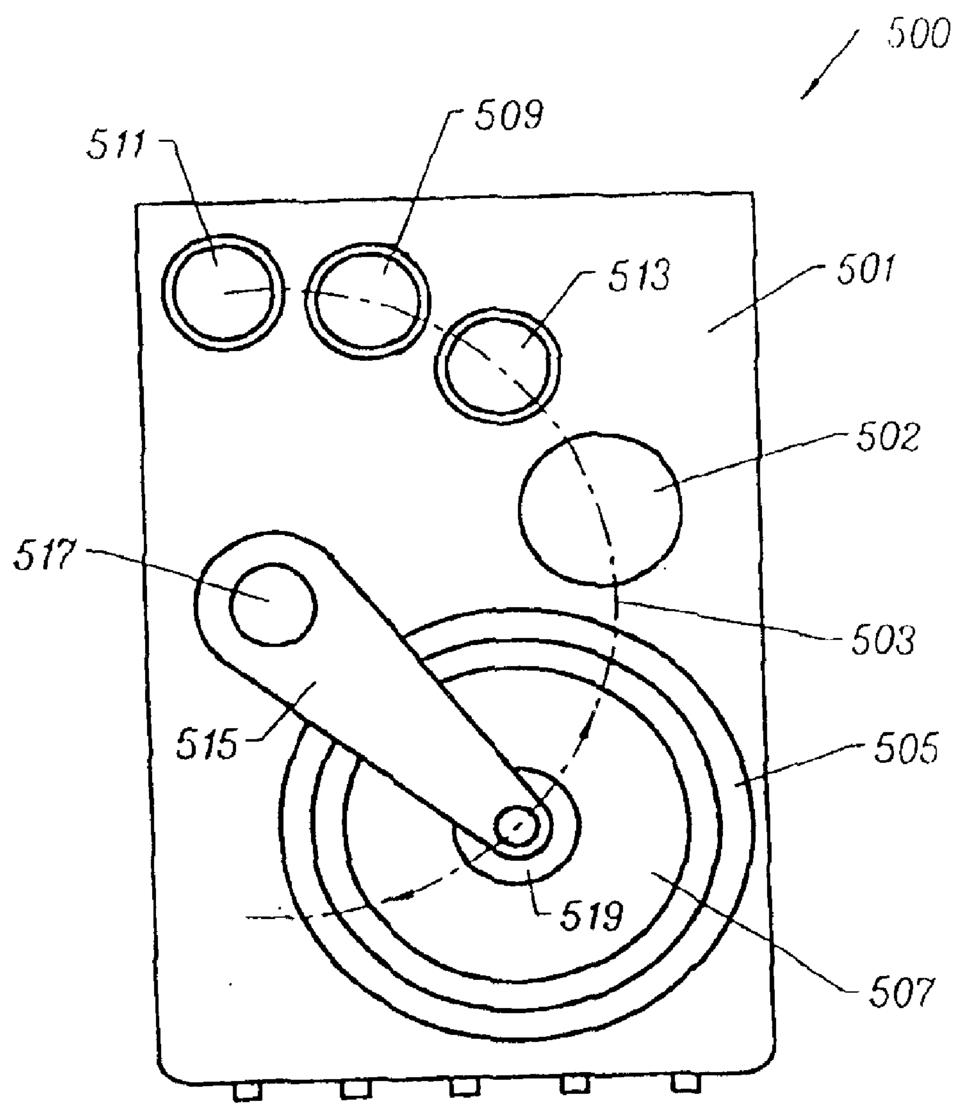
FIG. 5 is a simplified diagram of a polishing apparatus according to an alternative embodiment of the present invention.

FIG. 5 is a simplified top view diagram 500 of a multi-pad CMP apparatus according to an embodiment of the present invention. This diagram is merely example, which should not limit the scope of the claims herein. One of ordinary skill in the art would recognizes many other variations, modifications, and alternatives. As shown, the diagram 500 illustrates a top-view of a base panel 501, which houses a variety of systems and sub-systems. The base panel 501 is a frame support structure, which has doors for enclosing the frame support structure.

The panel includes a polishing head 515 (or arm), which pivots about member 517. The polishing head extends from member 517 to a region overlying the object 507 to be polished. The object can be a variety of work pieces, such as a semiconductor wafer, a glass plate, a flat panel, a blank wafer, a disk, and other objects with surfaces that need polishing or planarization. The object often rests on and is attached to a base plate or platen 505. The base plate can often rotate the object in either direction. Additionally, the base plate can ramp up in speed, or step up in speed, or perform other functions.

The polishing head includes a polishing pad 19, which is coupled to the polishing head. The polishing pad rotates in a circular or orbital manner and traverses across the surface of the object. The polishing pad can also move in the vertical direction to a selected height. Other functions of the polishing pad have been previously noted and also apply here, but should not unduly limit this embodiment.

The polishing pad can move from the object to one of a plurality of sites. These sites include a disposal site 502, where the polishing pad can be removed. The disposal site can also include a device, such as the handling arms, which are used to remove the polishing pad and cap from the polishing head. Here, the polishing arm completes a polishing process, is elevated, and traverse to the disposal site 502, where the handling arms clamp the cap, the drive motor turns the drive shaft to free the cap, and the polishing head lifts up to free itself from the cap. Next, the arms release the cap, including the pad, into the disposal site. In a specific embodiment, the disposal site can be covered, when it is not in use to prevent particulate contamination from being released from the disposal site to the object.

Shaping Polishing Pad

Figure 6A:
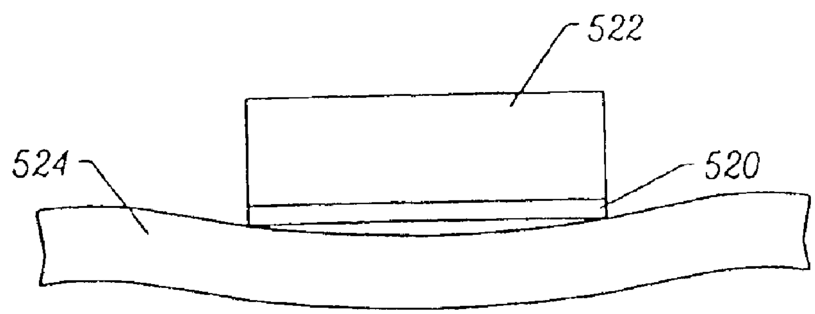
FIG. 6A is a simplified diagram schematically illustrating nonuniform polishing using a polishing pad.

Another aspect of the invention is directed to modifying the shape of the polishing pad to eliminate or reduce nonuniformity of the wafer during CMP. As shown in FIG. 6A, the relatively high downforce applied on the polishing pad 520 by the pad holder 522 tends to deform the wafer 524 into a dish shape during CMP. If the pad 520 is relatively hard, it will remain substantially planar and the edge region of the pad 520 will be more likely to make contact with the wafer surface than the center region of the pad 520. This contact creates rings on the wafer surface during CMP and causes planarization non-uniformity. One way to reduce the ring effect is to use a softer polishing pad material. Alternatively, the polishing pad can be rotated at a higher spinning or grinding speed. These solutions may be undesirable.

One aspect of the invention is to modify a polishing pad (typically made of a very hard material) by conditioning it in situ using a wafer and sheet abrasive to generate a profile on the surface of the pad. The pad profile so formed is more suitable or optimized for polishing a wafer under the same forces during CMP to achieve superior planarity and maintain uniformity.

Figure 6B:
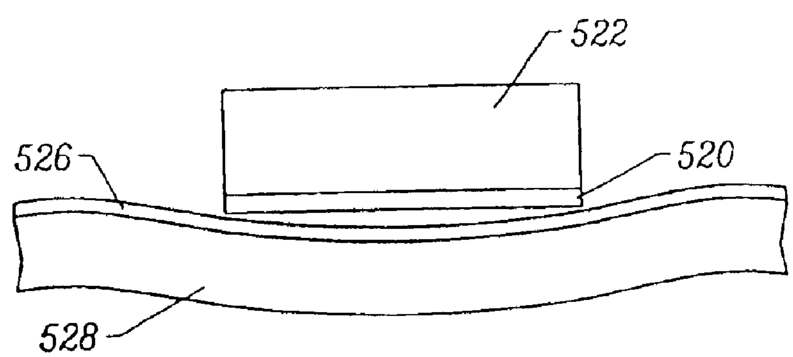
FIG. 6B is a simplified diagram schematically illustrating the conditioning and shaping of a polishing pad using a dummy wafer.
Figure 6C:
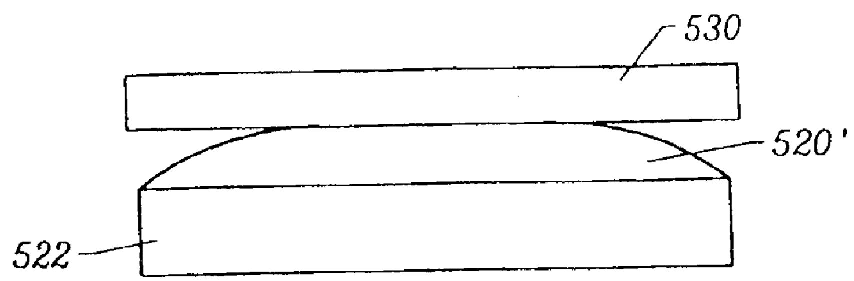
FIG. 6C is a simplified diagram schematically illustrating the profile of a conditioned polishing pad.

In one embodiment, a layer of fine sand paper 526 (e.g., 600 G) is bonded to the surface of a dummy wafer or conditioning wafer 528 for use in conditioning a polishing pad 520 prior to the actual planarization process, as seen in FIG. 6B. The polishing pad 520 is placed in contact with the sand paper 526 using a downforce and under conditions similar to the actual planarization process, while the polishing speeds may be reduced from the speeds during actual planarization. The sand paper 526 will wear down the polishing pad 520 at the edge region. The polishing pad is checked periodically, typically at short time intervals (e.g., about 5–10 seconds), until the beginning of a polish pattern is detected in the center region of the pad. This signals that the desired polishing pad shape is achieved for use in the actual planarization process. In general, the desired shape of the polishing pad 520' has a substantially flat center region and a rounded edge region, as shown in FIG. 6C. This can be observed by holding a precision rule 530 against the surface and observing the flatness of the center region. Over-conditioning the pad is undesirable by eliminating the flat center region and destroying planarity. Of course, other abrasive material can be used instead of the sand paper.

After conditioning the polishing pad 520', the sand paper is flushed to remove particles thereon. The polishing pad 520' is cleaned and the dummy wafer 528 is removed. The same apparatus may be cleaned and used for actual planarization, or a different apparatus may be employed to planarize a wafer using the conditioned polishing pad 520'.

In another embodiment, the shape of the conditioned polishing pad 520' can be used to preform polishing pads having the same profile to be used for CMP under the same conditions. The pads may be preformed by molding. In this way, the shaping of the polishing pad 520' only needs to be performed once for the particular CMP application.

Polishing Chemical Delivery

Figure 7:
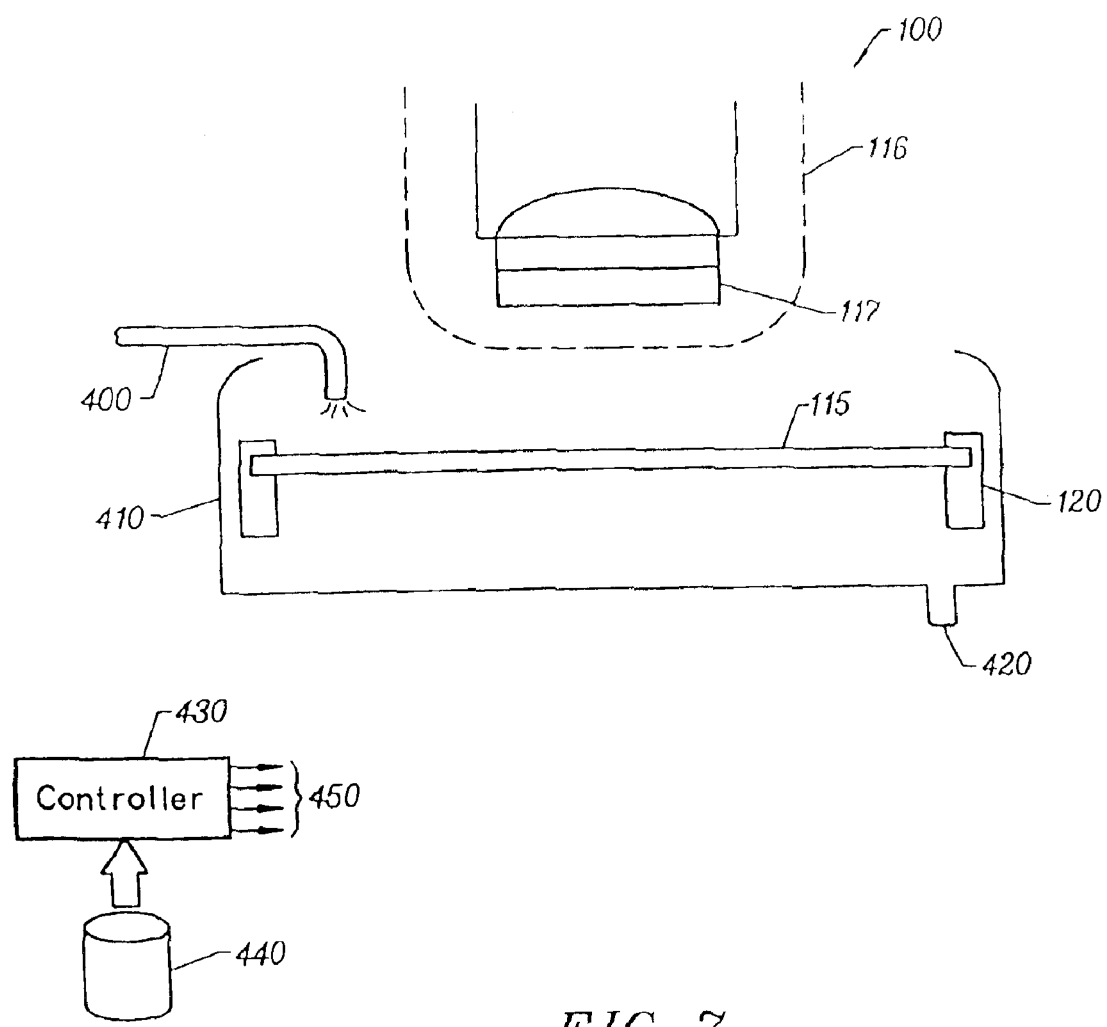
FIG. 7 is an alternative diagram of a planarization apparatus according to another embodiment of the present invention.

FIG. 7 is an alternative diagram of planarization apparatus 100 according to another embodiment of the present invention. This diagram is merely an example, which should not limit the scope of the claims herein. One of ordinary skill in the art would recognize many other variations, modifications, and alternatives. In a specific embodiment, a slurry delivery mechanism 400 is provided to dispense a polishing slurry (not shown) onto the process surface of wafer 115 during planarization. Although FIG. 7 shows a single mechanism 400 or dispenser 400, additional dispensers may be provided depending on the polishing requirements of the wafer. Polishing slurries are known in the art. For example, typical slurries include a mixture of colloidal silica or dispersed alumina in an alkaline solution such as KOH, $NH_4OH$ or $CeO_2$. Alternatively, slurry-less pad systems can be used.

A splash shield 410 is provided to catch the polishing fluids and to protect the surrounding equipment from the caustic properties of any slurry that might be used during planarization. The shield material can be polypropylene or stainless steel, or some other stable compound that is resistant to the corrosive nature of polishing fluids. The slurry can be dispose via a drain 420.

A controller 430 in communication with a data store 440 issues various control signals 450 to the foregoing-described components of the planarization apparatus. The controller provides the sequencing control and manipulation signals to the mechanics to effectuate a planarization operation. The data store 440 can be externally accessible. This permits user-supplied data to be loaded into the data store 440 to provide the planarization apparatus with the parameters for planarization. This aspect of the invention will be further discussed below.

Any of a variety of controller configurations is contemplated for the present invention. The particular configuration will depend on considerations such as throughput requirements, available footprint for the apparatus, system features other than those specific to the invention, implementation costs, and the like. In a specific embodiment, controller 430 is a personal computer loaded with control software. The personal computer includes various interface circuits to each component of apparatus 100. The control software communicates with these components via the interface circuits to control apparatus 100 during planarization. In this embodiment, data store 440 can be an internal hard drive containing desired planarization parameters. User-supplied parameters can be keyed in manually via a keyboard (not shown). Alternatively, the data store 440 is a floppy drive in which case the parameters can be determined elsewhere, stored on a floppy disk, and carried over to the personal computer. In yet another alternative, the data store 440 is a remote disk server accessed over a local area network. In still yet another alternative, the data store 440 is a remote computer accessed over the Internet; for example, by way of the world wide web, via an FTP (file transfer protocol) site, and so on.

In another embodiment, controller 430 includes one or more microcontrollers that cooperate to perform a planarization sequence in accordance with the invention. Data store 440 serves as a source of externally provided data to the microcontrollers so they can perform the polish in accordance with user-supplied planarization parameters. It should be apparent that numerous configurations for providing user-supplied planarization parameters are possible. Similarly, it should be clear that numerous approaches for controlling the constituent components of the planarization apparatus are possible.

Figure 8:
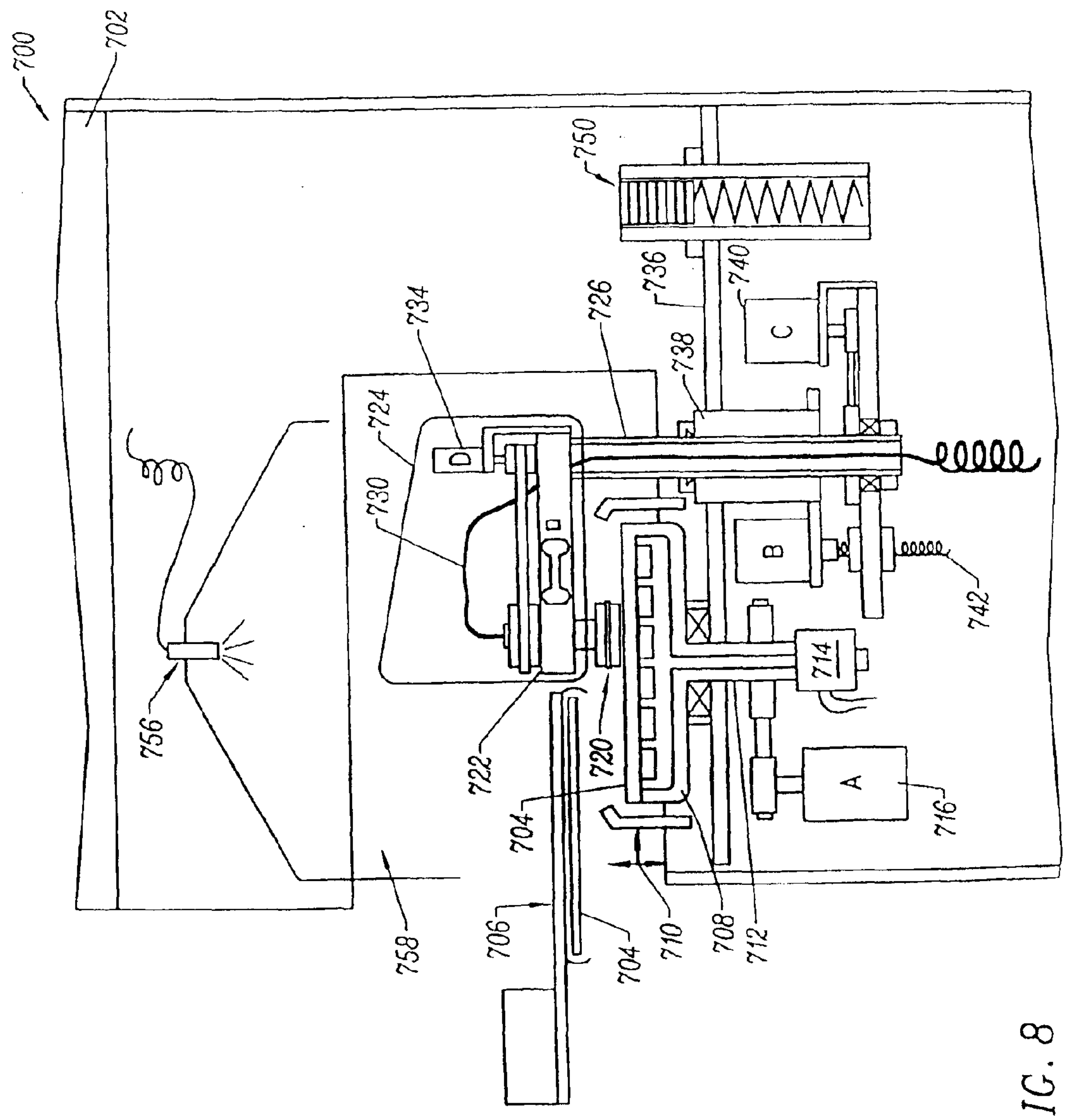
FIG. 8 is a simplified diagram of a planarization apparatus according to another embodiment of the present invention.

FIG. 8 shows a CMP apparatus 700 disposed in a process cavity 702. A wafer 704 is transported into the process cavity 702 using a robot end effector (edge grip) 706 and supported on a wafer platen 708 which may be a vacuum chuck made of a porous material. A splash shield 710 is desirably placed around the wafer and platen 708. The wafer platen 708 is supported on a rotary shaft 712 which is coupled with a vacuum rotary union 714. A wafer drive motor 716 is connected to the rotary shaft 712 to spin the shaft 712, platen 708, and wafer 704.

A polishing chuck 720 is disposed above the wafer 704 and supported on an arm 722. The arm 722 is housed in an arm cover 724 and supported on an arm support pivot tube 726 which has a hollow center through which a slurry chemical supply tube 730 extends for supplying a slurry chemical to the polishing chuck 720. A spindle drive motor 734 drives a spindle coupled to the polishing chuck 720 to rotate around its axis to spin the polishing pad over the wafer surface. The pivot tube 726 is rotatable relative to the frame 736 and is mounted to the frame by a bearing assembly 738. An arm rotation drive assembly and motor unit 740 rotates the arm 722 through the arm support tube 726 around the axis of the tube 726. An arm lift assembly and drive unit 742 is provided to move the arm 722 up and down through the arm support tube 726. An auto change pad magazine 750 may be provided for supplying polishing pads which are detachably connected to the polishing chuck 720 for polishing the wafer 704. A cavity spray rinse/wash 756 is disposed on top of the apparatus 700 with a splash containment cover 758 surrounding the upper portion to reduce splashing.

Figure 9:
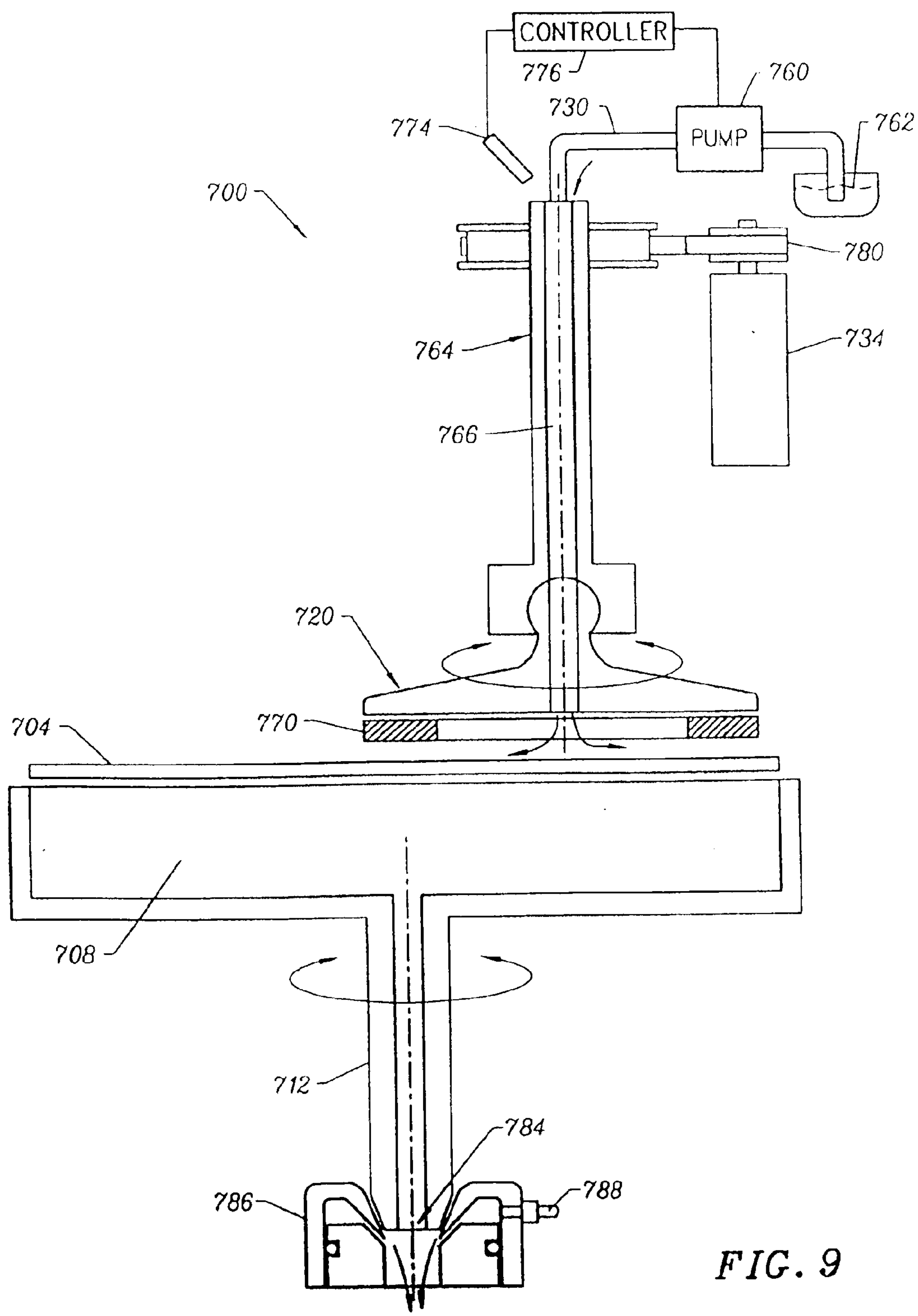
FIG. 9 is a simplified diagram illustrating a fluid delivery system in the planarization apparatus of FIG. 8.

FIG. 9 shows additional details of the delivery of the slurry chemical. A pump 760 pumps the slurry chemical from a source 762 through the supply tube 730 to a hollow spindle shaft 764 connected to the polishing chuck 720. The chemical flows through the channel 766 in the spindle shaft 764 and the polishing chuck 720 under gravity, and into the region between the annular polishing pad 770 and the surface of the wafer 704. The center application of the chemical through a removed center portion of the polishing pad 770 advantageously produces uniform chemical distribution even at high spindle speeds, thereby minimizing chemical consumption. The use of a slurry-less pad 770 eliminates the problem of slurry build-up in the spindle 764. A non-contact level sensor 774 is desirably provided to monitor the chemical level in the channel 766 of the shaft 764 to ensure proper chemical flow. The sensor information can be used to control the pump 760 via a pump controller 776 to adjust the pumping to achieve the desired chemical flow rate and level and avoid flow interruption. FIG. 9 further shows a belt and pulley coupling 780 between the spindle drive motor 734 and the spindle shaft 764. The wafer holding vacuum for the vacuum chuck 708 is generated by using a high velocity air (or water or other fluids) flow away from the opening 784 at the bottom of the wafer chuck shaft 712. This may employ a non-contact vacuum venturi 786 with compressed air flow 788 for increased reliability.

Planarization Calibration System

Figure 10:
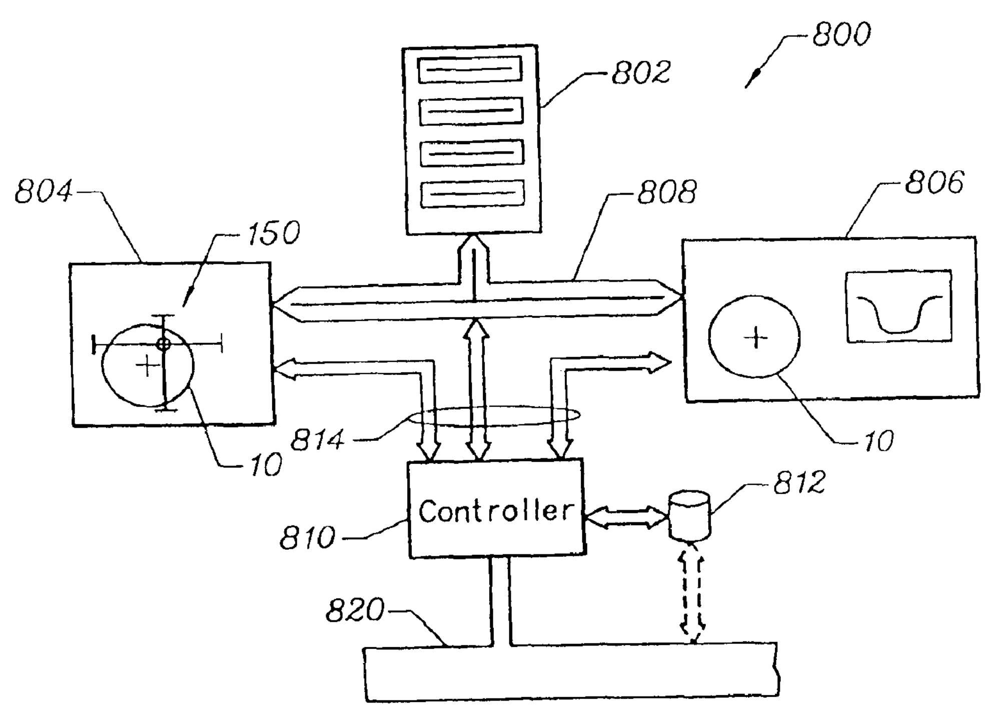
FIG. 10 is a simplified block diagram of a planarization calibration system of the present invention.

FIG. 10 is a simplified block diagram of a planarization calibration system of the present invention. It is noted that the figure is merely a simplified block diagram representation highlighting the components of the planarization apparatus of the present invention. The system shown is exemplary and should not unduly limit the scope of the claims herein. A person of ordinary skill in the relevant arts will recognize many variations, alternatives and modifications without departing from the scope and spirit of the invention. Planarization system 800 includes a planarization station 804 for performing planarization operations. Planarization station 804 can use a network interface card (not shown) to interface with other system components, such as a wafer supply, measurement station, transport device, etc. There is a wafer supply 802 for providing blank test wafers and for providing production wafers. A measurement station 806 is provided for making surface measurements from which the removal profiles are generated. The planarization station 804, wafer supply 802 and measurement station 806 are operatively coupled together by a robotic transport device 808. A controller 810 includes control lines and data input lines 814 that cooperatively couple together the constituent components of system 800. Controller 810 includes a data store 812 for storing at least certain user-supplied planarization parameters. Alternatively, data store 812 can be a remotely accessed data server available over a network in a local area network.

Controller 810 can be a self-contained controller having a user interface to allow a technician to interact with and control the components of system 800. For example, controller 810 can be a PC-type computer having contained therein one or more software modules for communicating with and controlling the elements of system 800. Data store 812 can be a hard drive coupled over a communication path 820, such as a data bus, for data exchange with controller 810.

In another configuration, a central controller (not shown) accesses controller 810 over communication path 820. Such a configuration might be found in a fabrication facility where a centralized controller is responsible for a variety of such controllers. Communication path 820 might be the physical layer of a local area network. As can be seen, any of a number of controller configurations is contemplated in practicing the invention. The specific embodiment will depend on considerations such as the needs of the end-user, system requirements, system costs, and the like.

The system diagrammed in FIG. 10 can be operated in production mode or in calibration mode. During a production run, wafer supply 802 contains production wafers. During a calibration run, wafer supply 802 is loaded with test wafers. Measurement station 806 is used primarily during a calibration run to perform measurements on polished test wafers to produce removal profiles. However, measurement station 806 can also be used to monitor the quality of the polish operation during production runs to monitor process changes over time.

In another embodiment, measurement system 806 can be integrated into planarization station 804. This arrangement provides in situ measurement of the planarization process. As the planarization progresses, measurements can be taken. These real time measurements allow for fine-tuning of the planarization parameters to provide higher degrees of uniform removal of the film material.

The program code constituting the control software can be expressed in any of a number of ways. The C programming language is a commonly used language because many compilers exist for translating the high-level instructions of a C program to the corresponding machine language of the specific hardware being used. For example, some of the software may reside in a PC based processor. Other software may be resident in the underlying controlling hardware of the individual stations, e.g., planarization station 804 and measurement station 806. In such cases, the C programs would be compiled down to the machine language of the microcontrollers used in those stations. In one specific embodiment, the system employs a PC-based local or distributed control scheme with soft logic programming control.

As an alternative to the C programming language, object-oriented programming languages can be used. For example, C++ is a common object-oriented programming language. The selection of a specific programming language can be made without departing from the scope and spirit of the present invention. Rather, the selection of a particular programming language is typically dependent on the availability of a compiler for the target hardware, the availability of related software development tools, and on the preferences of the software development team.

Modular CMP System

Figure 11:
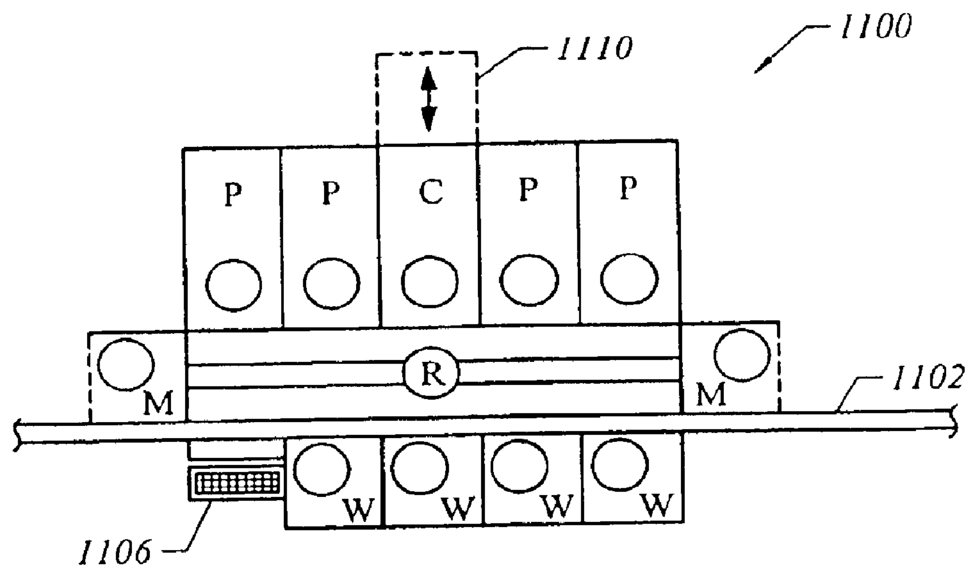
FIG. 11 is a simplified diagram of a modular system according to an embodiment of the present invention.
Figure 12:
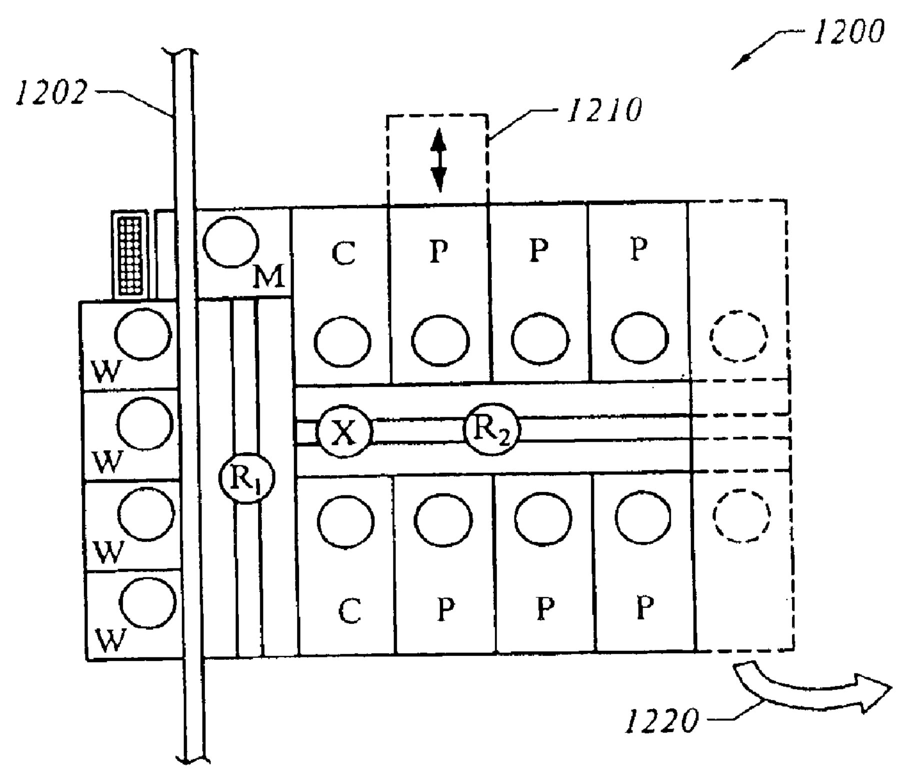
FIG. 12 is a simplified diagram of a modular system according to another embodiment of the present invention.

FIGS. 11 and 12 show examples of modular CMP systems. The modular system 1100 in FIG. 11 includes 4 process modules P, 1 cleaning module C, 1 wafer handling member or robot R, 4 wafer storage units W, and 2 metrology modules M in an arrangement that reduces footprint and increases throughput. FIG. 12 shows another modular system 1200 including 6 process modules P, 2 cleaning modules C, 2 wafer handling members or robots $R_1$, $R_2$, 4 wafer storage units W, and 1 metrology module M. The modular system 1100 is a relatively shallow configuration with a bulkhead 1102, while the module system 1200 is a relatively deep configuration with a bulkhead 1202. An operative interface panel 1106 is disposed with the wafer storage units W on one side of the bulkhead 1102 having automated guided vehicle (AGV) access in FIG. 11. Similarly, an operative interface panel 1206 is disposed with the wafer storage units W on one side of the bulkhead 1202 in FIG. 12.

Figure 13:
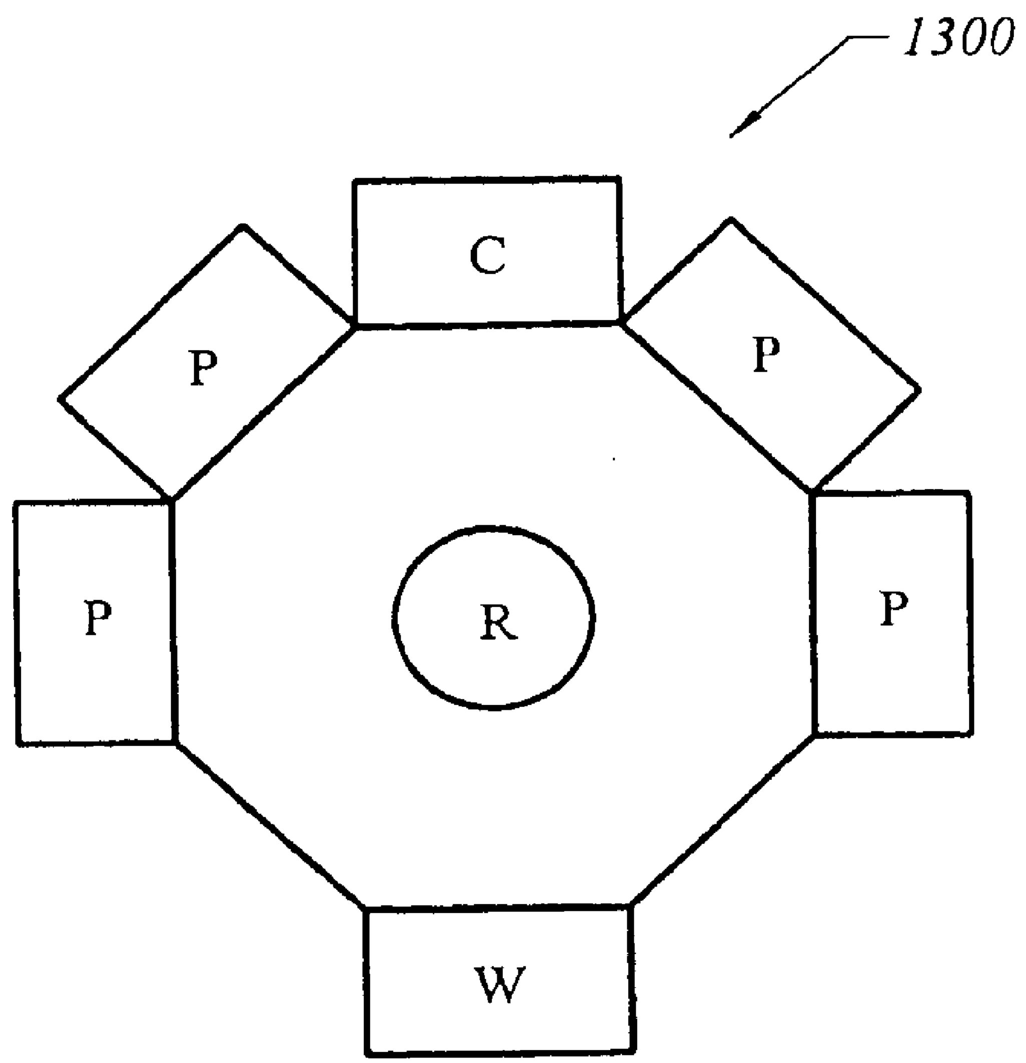
FIG. 13 is a simplified diagram of a modular system according to another embodiment of the present invention.

FIG. 11 illustrates withdrawal 1110 of the cleaning module C for maintenance or replacement. FIG. 12 illustrates withdrawal 1210 of a process module P for maintenance or replacement. The plug-in configuration of the modules provides interchangeability of the modules while continuing operation with the other modules. During module removal, the fluid line, communication/electrical line, interlocks, and the like are disconnected and reconnected. Different configurations can be created with identical modules. The modular configuration allows one to select a configuration that best suits its needs, and provides flexibility in the number of types of modules used as well as the space required. The module size can range from a small system (e.g., 1 process, 1 clean, 1 robot, and 1 foup for full dry in/dry out capability in a very small footprint for development work) to a large system with multiple process modules, cleaning modules, robots, and foups. It is possible to form a double-ended system by adding a mirror image of the modules on the other side of the symmetry line 1220. With a double ended system, it is conceivable to have up to 4 cleaning modules, 16 or 20 process modules, and 8 or 10 foups per configuration. The modular system may further be expanded, for instance, by stacking the modules. FIG. 13 shows an alternative modular system 1300 having modules in a cluster arrangement with all the modules facing a polar type robot R with angular spaces therebetween.

In some embodiments, the plurality of modules in the modular system 1100 are controlled separately by individual controllers to process one or more substrates therein. Each module can operate autonomously and separately from the other modules. This is one way to allow one of the modules to be conveniently disengaged from the docking station of the modular system 1100, while the other modules are still operable to process the one or more substrates therein. The individual controller may include, for example, components for controlling temperature, pressure, polish force, process timing, spindle and wafer chuck speeds, chemical and D.I. water flow, endpoint detection set points, automated sequencing and timing, or the like.

When it is desirable to remove one module and replace it with a replacement module, the replacement module may be prequalified offline prior to inserting the replacement module into the docking station and engaging the module for operation with the docking station. The replacement module has an individual controller associated with the replacement module separate from the controllers for the other modules. The replacement module can be prequalified using the individual controller associated with the replacement module to process one or more substrates therein for a preset process, such as a specific CMP process or cleaning process. Prequalifying the replacement module may include processing one or more substrates therein for the preset process separately from the docking station, and verifying that the replacement module meets preset minimum performance requirements based on process results of the one or more substrates processed therein. For a CMP process, the preset minimum performance requirements may include a minimum level of planarization, dishing and erosion, removal rates, site total thickness variation (TTV), process pad life, automated puck handling performance, sensor set point levels, surface roughness, or the like. For a cleaning process, the preset minimum performance requirements may include number of defects, residue and/or particles left after the cleaning process, or the like.

The modules may also be individually prequalified offline prior to coupling them to the docking station of the modular system 1100. This distributed control scheme for the modules using their own separate controllers renders the modular system 1100 more flexible and robust.

The modular system may further employ input and output tools such as the standard mechanical interface system (SMIF™) available from Asyst Technologies. An SMIF-Pod™ provides contamination control during transport and storage by isolating the wafer cassettes from the ambient environment, and maintains and controls cleanliness essentially independent of the external room environment.

While the above is a full description of the specific embodiments, various modifications, alternative constructions and equivalents known to those of ordinary skill in the relevant arts may be used. For example, while the description above is in terms of a semiconductor wafer, it would be possible to implement the present invention with almost any type of article having a surface or the like. Therefore, the above description and illustrations should not be taken as limiting the scope of the present invention which is defined by the appended claims.

What is claimed is:

1. A method of operating a modular chemical mechanical planarization process, the method comprising:

operating a CMP apparatus comprising a docking station including a plurality of modules having at least one CMP module and at least one cleaning module to process one or more substrates therein, the plurality of modules being controllable separately by individual controllers associated separately with the modules;

disengaging one of the modules from the docking station;

mechanically removing the one disengaged module to free the module from the docking station;

inserting a replacement module into the docking station and engaging the module for operation with the docking station while the other modules are still operable to process the one or more substrates therein; and prequalifying the replacement module using the individual controller associated with the replacement module to process one or more substrates therein for a preset process prior to inserting the replacement module into the docking station and engaging the module for operation with the docking station;

wherein prequalifying the replacement module comprises processing one or more substrates therein for the preset process offline; and verifying that the replacement module meets preset minimum performance requirements based on process results of the one or more substrates processed therein.

2. The method of claim 1 wherein the disengaging comprises removing power and control signals from the docking station.

3. The method of claim 1 wherein the disengaging comprises removing an exhaust port, a water line, and a plurality of chemical fluid lines from the docking station.

4. The method of claim 1 further comprising inserting a replacement module into the docking station and engaging the module for operation with the docking station while the other modules are still operable to process the one or more substrates therein.

5. The method of claim 1 wherein the disengaging and mechanically removing take less than five minutes.

6. The method of claim 1 wherein the cleaning station also dries the object.

7. The method of claim 1 wherein the plurality of modules are arranged on a first side of a substrate handling mechanism configured to transfer substrates between modules.

8. The method of claim 7 wherein a plurality of wafer storage units are arranged on a second side of the substrate handling mechanism opposite from the first side.

9. The method of claim 7 wherein the plurality of modules are linearly arranged on the first side of the substrate handling mechanism.

10. The method of claim 1 wherein the plurality of modules comprise at least one CMP module and at least one cleaning module arranged on a first side, and at least one CMP module and atleast one cleaning module arranged on a second side opposite from the first side, of a substrate handling mechanism configured to transfer substrates between modules.

11. The method of claim 10 wherein the plurality of modules are arranged in a cluster around a substrate handling mechanism configured to transfer substrates between modules.

12. The method of claim 1 wherein operating the CMP apparatus comprises polishing a surface of a substrate in a CMP module using a polishing pad which is substantially smaller in surface area than the substrate.

13. A method of operating a modular chemical mechanical planarization process, the method comprising:

operating a CMP apparatus comprising a docking station including a plurality of modules having at least one CMP module and at least one cleaning module to process one or more substrates therein;

disengaging one of the modules from the docking station;

inserting a replacement module into the docking station and engaging the module for operation with the docking station while the other modules are still operable to process the one or more substrates therein; and prequalifying the replacement module using the individual controller associated with the replacement module to process one or more substrates therein for a preset process prior to inserting the replacement module into the docking station and engaging the module for operation with the docking station;

wherein prequalifying the replacement module comprises processing one or more substrates therein for the preset process offline; and verifying that the replacement module meets preset minimum performance requirements based on process results of the one or more substrates processed therein.

14. The method of claim 13 wherein the disengaging comprises removing power and control signals from the docking station.

15. The method of claim 13 wherein the replacement module has an individual controller associated with the replacement module separate from the controllers for the modules of the docking station.

16. The method of claim 15 further comprising prequalifying the replacement module using the individual controller associated with the replacement module to process one or more substrates therein for a preset process prior to inserting the replacement module into the docking station and engaging the module for operation with the docking station 13 wherein the one of the modules is disengaged from the docking station while the other modules are still operable to process the one or more substrates therein.

17. The method of claim 16 wherein prequalifying the replacement module comprises processing one or more substrates therein for the preset process separately from the docking station; and verifying that the replacement module meets preset minimum performance requirements based on process results of the one or more substrates processed therein 13 further comprising controlling the plurality of modules separately by individual controllers to process one or more substrates therein.

18. The method of claim 13 wherein controlling the plurality of modules separately comprises controlling separately at least one of temperature, pressure, polish force, process timing, spindle and wafer chuck speeds, chemical and D.I. water flow, endpoint detection set points, and automated sequencing and timing of the modules.

19. A method of operating a modular chemical mechanical planarization process, the method comprising:

providing a plurality of modules having at least one CMP module and at least one cleaning module to process one or more substrates therein;

prequalifying at least one of the plurality of modules separately each for a preset process associated therewith using the individual controller associated with the at least one module;

coupling the plurality of modules including the at least one prequalified module with a docking station of a CMP apparatus; and operating the CMP apparatus to process one or more substrates in the plurality of modules;

wherein prequalifying the at least one module comprises processing one or more substrates therein for the preset process associated therewith offline; and verifying that the at least one module meets preset minimum performance requirements based on process results of the one or more substrates processed therein.

20. The method of claim 19 further comprising disengaging one of the modules from the docking station, while the other modules are still operable to process the one or more substrates therein.

21. The method of claim 19 wherein the plurality of modules are controllable separately by individual controllers to process the one or more substrates therein.

* * * * *